US010407773B2

(12) United States Patent
LaVoie et al.

(10) Patent No.: US 10,407,773 B2
(45) Date of Patent: *Sep. 10, 2019

(54) METHODS AND APPARATUSES FOR SHOWERHEAD BACKSIDE PARASITIC PLASMA SUPPRESSION IN A SECONDARY PURGE ENABLED ALD SYSTEM

(71) Applicant: Lam Research Corporation, Fremont, CA (US)

(72) Inventors: Adrien LaVoie, Newberg, OR (US); Hu Kang, Tualatin, OR (US); Purushottam Kumar, Hillsboro, OR (US); Shankar Swaminathan, Beaverton, OR (US); Jun Qian, Sherwood, OR (US); Frank L. Pasquale, Beaverton, OR (US); Chloe Baldasseroni, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 165 days.

This patent is subject to a terminal disclaimer.

(21) Appl. No.: 15/445,632

(22) Filed: Feb. 28, 2017

(65) Prior Publication Data

US 2017/0167017 A1 Jun. 15, 2017

Related U.S. Application Data

(62) Division of application No. 14/447,203, filed on Jul. 30, 2014, now Pat. No. 9,617,638.

(51) Int. Cl.
*C23C 16/50* (2006.01)
*C23C 16/455* (2006.01)
(Continued)

(52) U.S. Cl.
CPC .......... *C23C 16/50* (2013.01); *C23C 16/4408* (2013.01); *C23C 16/4558* (2013.01);
(Continued)

(58) Field of Classification Search
CPC .............. C23C 16/50; C23C 16/45582; C23C 16/45544; C23C 16/4558; C23C 16/52;
(Continued)

(56) References Cited

U.S. PATENT DOCUMENTS

| 4,673,447 A | 6/1987 | Sakai et al. |
| 5,871,811 A | 2/1999 | Wang et al. |

(Continued)

FOREIGN PATENT DOCUMENTS

| CN | 102087955 A | 6/2011 |
| CN | 102136410 A | 7/2011 |

(Continued)

OTHER PUBLICATIONS

U.S. Appl. No. 15/186,275, filed Jun. 17, 2016, entitled "Showerhead Curtain Gas Method and System for Film Profile Modulation."

(Continued)

*Primary Examiner* — Jeffrie R Lund
(74) *Attorney, Agent, or Firm* — Weaver Austin Villeneuve & Sampson LLP

(57) ABSTRACT

Disclosed are methods of depositing films of material on semiconductor substrates employing the use of a secondary purge. The methods may include flowing a film precursor into a processing chamber and adsorbing the film precursor onto a substrate in the processing chamber such that the precursor forms an adsorption-limited layer on the substrate. The methods may further include removing at least some unadsorbed film precursor from the volume surrounding the adsorbed precursor by purging the processing chamber with a primary purge gas, and thereafter reacting adsorbed film (Continued)

precursor while a secondary purge gas is flowed into the processing chamber, resulting in the formation of a film layer on the substrate. The secondary purge gas may include a chemical species having an ionization energy and/or a disassociation energy equal to or greater than that of $O_2$. Also disclosed are apparatuses which implement the foregoing processes.

17 Claims, 7 Drawing Sheets

(51) Int. Cl.
    *C23C 16/52*     (2006.01)
    *H01L 21/02*     (2006.01)
    *C23C 16/44*     (2006.01)

(52) U.S. Cl.
    CPC .. *C23C 16/45519* (2013.01); *C23C 16/45527* (2013.01); *C23C 16/45536* (2013.01); *C23C 16/45544* (2013.01); *C23C 16/45565* (2013.01); *C23C 16/45582* (2013.01); *C23C 16/52* (2013.01); *H01L 21/0228* (2013.01); *H01L 21/0257* (2013.01); *H01L 21/0262* (2013.01); *H01L 21/02334* (2013.01)

(58) Field of Classification Search
    CPC .......... C23C 16/45519; C23C 16/4408; C23C 16/45536; C23C 16/45527; C23C 16/45565; H01L 21/0257; H01L 21/0228; H01L 21/0262; H01L 21/02334; H01L 21/02104; H01L 21/02112; H01L 21/02118; H01L 21/02123; H01L 21/02172; H01L 21/02227; H01L 21/0223; H01L 21/02271; H01L 21/02318; H01L 21/02337; H01L 21/02518; H01L 21/02612; H01L 21/02614; H01L 21/3141; H01L 21/3145; H01L 21/316; H01L 21/31641; H01L 21/3205; H01L 21/32105
    See application file for complete search history.

(56) References Cited

U.S. PATENT DOCUMENTS

| | | | |
|---|---|---|---|
| 5,892,235 A | 4/1999 | Yamazaki et al. | |
| 6,002,109 A | 12/1999 | Johnsgard et al. | |
| 6,143,081 A | 11/2000 | Shinriki et al. | |
| 6,192,858 B1 | 2/2001 | Nieberding | |
| 6,217,715 B1 | 4/2001 | Sun et al. | |
| 6,403,925 B1 | 6/2002 | Johnsgard et al. | |
| 8,409,351 B2 | 4/2013 | Robbins et al. | |
| 8,637,411 B2 | 1/2014 | Swaminathan et al. | |
| 8,728,956 B2 | 5/2014 | LaVoie et al. | |
| 8,871,654 B2 | 10/2014 | Kato et al. | |
| 8,956,983 B2 | 2/2015 | Swaminathan et al. | |
| 8,999,859 B2* | 4/2015 | Swaminathan | C23C 16/045 |
| | | | 438/763 |
| 9,508,547 B1* | 11/2016 | Pasquale | C23C 16/401 |
| 9,617,638 B2* | 4/2017 | LaVoie | C23C 16/45565 |
| 9,738,977 B1* | 8/2017 | Karim | H01J 37/32513 |
| 10,202,691 B2* | 2/2019 | Karim | C23C 16/45544 |
| 2002/0104556 A1 | 8/2002 | Puri et al. | |
| 2003/0192476 A1 | 10/2003 | Fork et al. | |
| 2008/0173401 A1 | 7/2008 | Jeon | |
| 2008/0280068 A1 | 11/2008 | Ahn | |
| 2009/0038541 A1 | 2/2009 | Robbins et al. | |
| 2009/0109595 A1 | 4/2009 | Herchen et al. | |
| 2009/0233434 A1 | 9/2009 | Kim et al. | |
| 2009/0270849 A1 | 10/2009 | Truckai et al. | |
| 2010/0078578 A1 | 4/2010 | Schuermann et al. | |
| 2012/0009802 A1 | 1/2012 | LaVoie et al. | |
| 2012/0043198 A1 | 2/2012 | Yamazaki | |
| 2012/0269968 A1* | 10/2012 | Rayner, Jr. | C23C 16/452 |
| | | | 427/255.26 |
| 2012/0318025 A1 | 12/2012 | Milicevic et al. | |
| 2013/0171834 A1* | 7/2013 | Haverkamp | C23C 16/24 |
| | | | 438/763 |
| 2013/0344245 A1 | 12/2013 | Xia et al. | |
| 2014/0011369 A1* | 1/2014 | Kato | H01L 21/02233 |
| | | | 438/771 |
| 2014/0044889 A1 | 2/2014 | Qi et al. | |
| 2014/0072726 A1 | 3/2014 | Kim | |
| 2014/0209562 A1 | 7/2014 | LaVoie et al. | |
| 2014/0217193 A1 | 8/2014 | Breiling et al. | |
| 2015/0017812 A1 | 1/2015 | Chandrasekharan et al. | |
| 2015/0030766 A1* | 1/2015 | Lind | C23C 16/4405 |
| | | | 427/209 |
| 2015/0048739 A1 | 2/2015 | Forster et al. | |
| 2015/0147889 A1 | 5/2015 | Yudovsky et al. | |
| 2015/0155157 A1 | 6/2015 | Song et al. | |
| 2015/0194298 A1 | 7/2015 | Lei et al. | |
| 2015/0200110 A1 | 7/2015 | Li et al. | |
| 2015/0243490 A1 | 8/2015 | Ryu et al. | |
| 2015/0262792 A1 | 9/2015 | Bera | |
| 2015/0275364 A1 | 10/2015 | Thompson et al. | |
| 2015/0299855 A1 | 10/2015 | Yudovsky et al. | |
| 2015/0299909 A1 | 10/2015 | Mizuno et al. | |
| 2015/0368798 A1 | 12/2015 | Kwong | |
| 2015/0380221 A1 | 12/2015 | Liu et al. | |
| 2016/0035566 A1* | 2/2016 | LaVoie | C23C 16/45565 |
| | | | 438/778 |
| 2016/0068953 A1 | 3/2016 | Li et al. | |
| 2016/0097122 A1 | 4/2016 | Yudovsky et al. | |
| 2016/0138160 A1 | 5/2016 | Lambert et al. | |
| 2017/0167017 A1* | 6/2017 | LaVoie | C23C 16/45565 |
| 2017/0362713 A1* | 12/2017 | Karim | H01J 37/32513 |

FOREIGN PATENT DOCUMENTS

| | | |
|---|---|---|
| CN | 103003924 A | 3/2013 |
| CN | 103510072 A | 1/2014 |
| JP | H7-312348 A | 11/1995 |
| JP | 2000-297368 A | 10/2000 |
| JP | 2003-536272 A | 12/2003 |
| JP | 2014-012891 A | 1/2014 |
| KR | 10-0891035 B1 | 3/2009 |
| TW | 201416488 A | 5/2014 |
| WO | WO 2014/092085 A1 | 6/2014 |

OTHER PUBLICATIONS

U.S. Office Action dated Dec. 15, 2015 issued in U.S. Appl. No. 14/447,203.
U.S. Notice of Allowance dated Jul. 29, 2016 issued in U.S. Appl. No. 14/447,203.
U.S. Notice of Allowance dated Nov. 8, 2016 issued in U.S. Appl. No. 14/447,203.
U.S. Notice of Allowance dated Jul. 20, 2016 issued in U.S. Appl. No. 14/828,291.
U.S. Office Action dated Nov. 22, 2016 issued in U.S. Appl. No. 15/186,275.
U.S. Notice of Allowance dated Feb. 24, 2017 issued in U.S. Appl. No. 14/447,203.
U.S. Notice of Allowance dated Apr. 14, 2017 issued in U.S. Appl. No. 15/186,275.
U.S. Office Action dated Jan. 18, 2018 issued in U.S. Appl. No. 15/636,128.
U.S. Final Office Action dated Jul. 6, 2018 issued in U.S. Appl. No. 15/636,128.
U.S. Notice of Allowance dated Sep. 21, 2018 issued in U.S. Appl. No. 15/636,128.
Chinese First Office Action dated Jul. 3, 2017 issued in CN 201510459965.1.
Chinese First Office Action dated Mar. 1, 2019 issued in CN 201710462095.2.

(56) References Cited

OTHER PUBLICATIONS

Japanese First Office Action dated Jun. 4, 2019 issued in JP 2015-144504.
Taiwanese Notice of Allowance and Search Report dated Jul. 25, 2019 issued in TW 108108815.

* cited by examiner

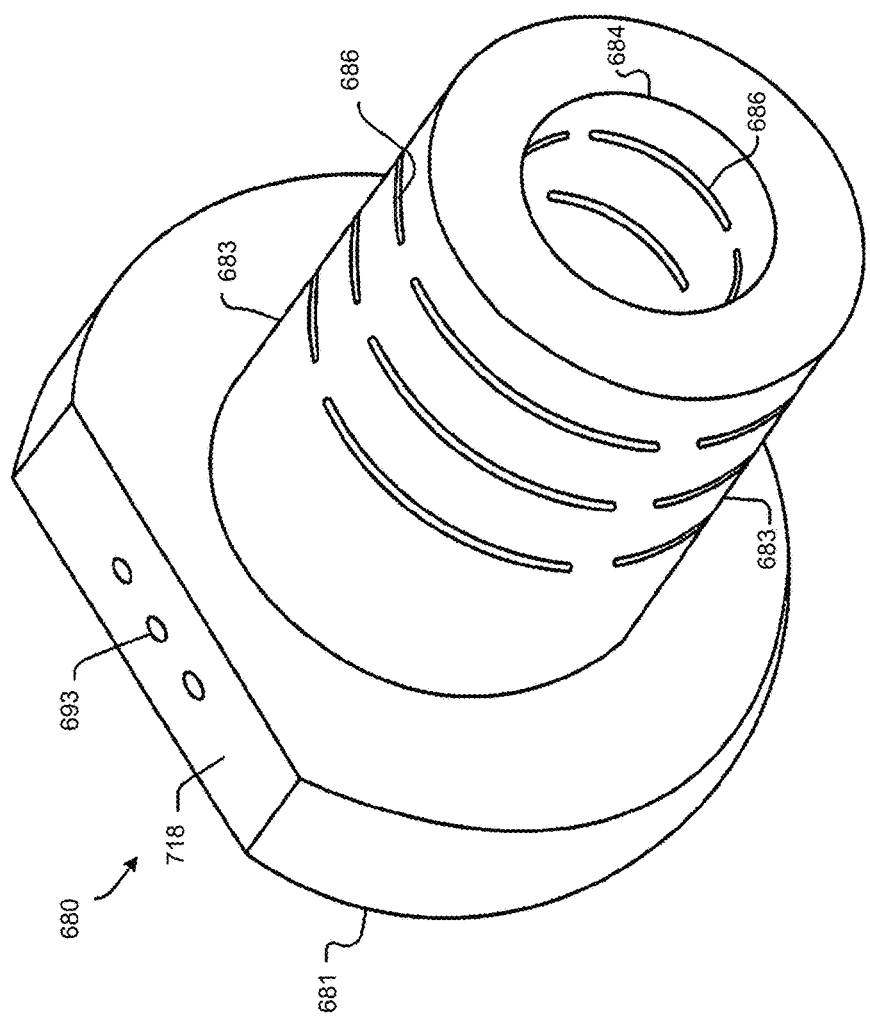

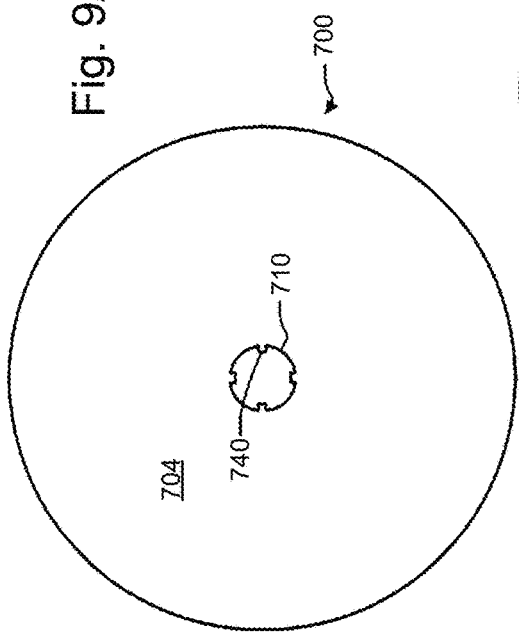
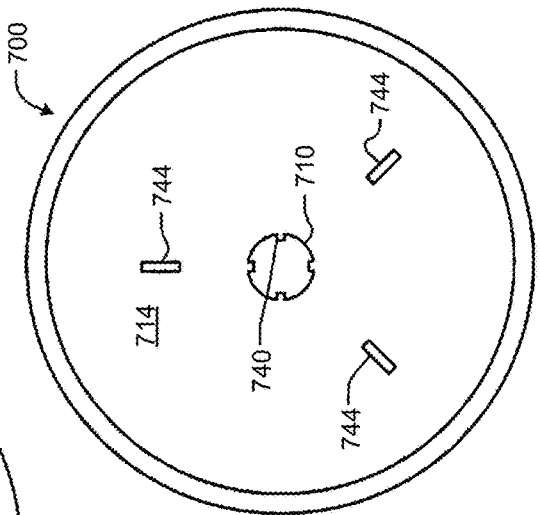
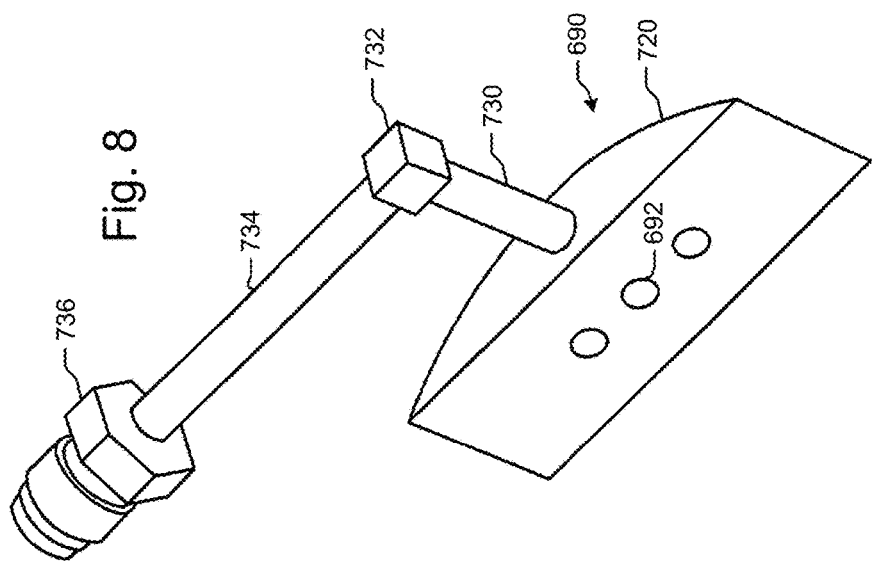

METHODS AND APPARATUSES FOR SHOWERHEAD BACKSIDE PARASITIC PLASMA SUPPRESSION IN A SECONDARY PURGE ENABLED ALD SYSTEM

CROSS-REFERENCE TO RELATED APPLICATIONS

This application is a divisional of U.S. patent application Ser. No. 14/447,203, filed on Jul. 30, 2014 and titled "METHODS AND APPARATUSES FOR SHOWERHEAD BACKSIDE PARASITIC PLASMA SUPPRESSION IN A SECONDARY PURGE ENABLED ALD SYSTEM," which is hereby incorporated by reference in its entirety.

BACKGROUND

As device and features size continue to shrink in the semiconductor industry, and also as 3D devices structures (e.g., Intel's Tri-Gate transistor architecture) become more prevalent in integrated circuit (IC) design, the capability of depositing thin conformal films (films of material having a uniform thickness relative to the shape of the underlying structure, even if non-planar) will continue to gain importance. Atomic layer deposition (ALD) is a film forming technique which is well-suited to the deposition of conformal films due to the fact that a single cycle of ALD only deposits a single thin layer of material, the thickness being limited by the amount of one or more film precursor reactants which may adsorb onto the substrate surface (i.e., forming an adsorption-limited layer) prior to the film-forming chemical reaction itself. Multiple "ALD cycles" may then be used to build up a film of the desired thickness, and since each layer is thin and conformal, the resulting film substantially conforms to the shape of the underlying devices structure.

There are many challenges associated with ALD processes, however. Often these challenges have to do with the fact that a single cycle of ALD only deposits a thin adsorption-limited layer, and thus many ALD cycles are required to build up a film of appreciable thickness. Each cycle takes time and requires repeated sequential operation of the apparatus used to accomplish the deposition process. Accordingly, improved methods and apparatuses are sought which improve the speed of wafer processing, and also improve the longevity and maintenance requirements of substrate processing hardware used to perform ALD operations.

SUMMARY

Disclosed are methods of depositing films of material on semiconductor substrates employing the use of a secondary purge. The methods may include flowing a film precursor into a processing chamber and adsorbing the film precursor onto a substrate in the processing chamber such that the precursor forms an adsorption-limited layer on the substrate. The methods may further include removing at least some unadsorbed film precursor from the volume surrounding the adsorbed precursor by purging the processing chamber with a primary purge gas, and thereafter reacting adsorbed film precursor while a secondary purge gas is flowed into the processing chamber, resulting in the formation of a film layer on the substrate. The secondary purge gas may include a chemical species having an ionization energy and/or a disassociation energy equal to or greater than that of $O_2$.

Also disclosed are apparatuses for depositing films of material on semiconductor substrates. The apparatuses may include a processing chamber, a substrate holder in the processing chamber, a showerhead for flowing film precursor and primary purge gas into the processing chamber, a showerhead collar for flowing a secondary purge gas into the processing chamber, one or more primary flow valves for controlling flow of film precursor and flow of primary purge gas through the showerhead, one or more secondary flow valves for controlling flow of secondary purge gas through the showerhead collar, a valve-operated vacuum source for removing primary and secondary purge gases from the processing chamber and for removing film precursor from the volume surrounding the substrate in the processing chamber, a plasma generator for generating a plasma in the processing chamber, and one or more controllers including machine-readable instructions for operating the one or more valves, vacuum source, and plasma generator to deposit a film of material onto a semiconductor substrate. The instructions of the controller may include instructions for operating the primary flow valve(s) to flow a film precursor into the processing chamber, instructions for controlling conditions within the processing chamber such that film precursor adsorbs onto the substrate in the processing chamber forming an adsorption-limited layer, instructions for operating the primary flow valve(s) to flow a primary purge gas into the processing chamber and operating the valve-operated vacuum source to evacuate it thereby removing at least some unadsorbed film precursor from the volume surrounding the adsorbed precursor, instructions for operating the plasma generator to form a plasma in the processing chamber which activates a reaction of the adsorbed film precursor to form a film layer on the substrate, and instructions for operating the secondary flow valve(s) to flow a secondary purge gas which includes $O_2$ into the processing chamber while the reaction of the adsorbed film precursor is activated by the plasma.

BRIEF DESCRIPTION OF THE DRAWINGS

FIG. 7 is a perspective view of an example of a showerhead collar.

FIG. 8 is a perspective view of an example fluid connector for the showerhead collar of FIG. 7.

FIGS. 9A and 9B are top and bottom plan views of example plates of the showerhead of FIG. 6.

DETAILED DESCRIPTION

Figure 1:
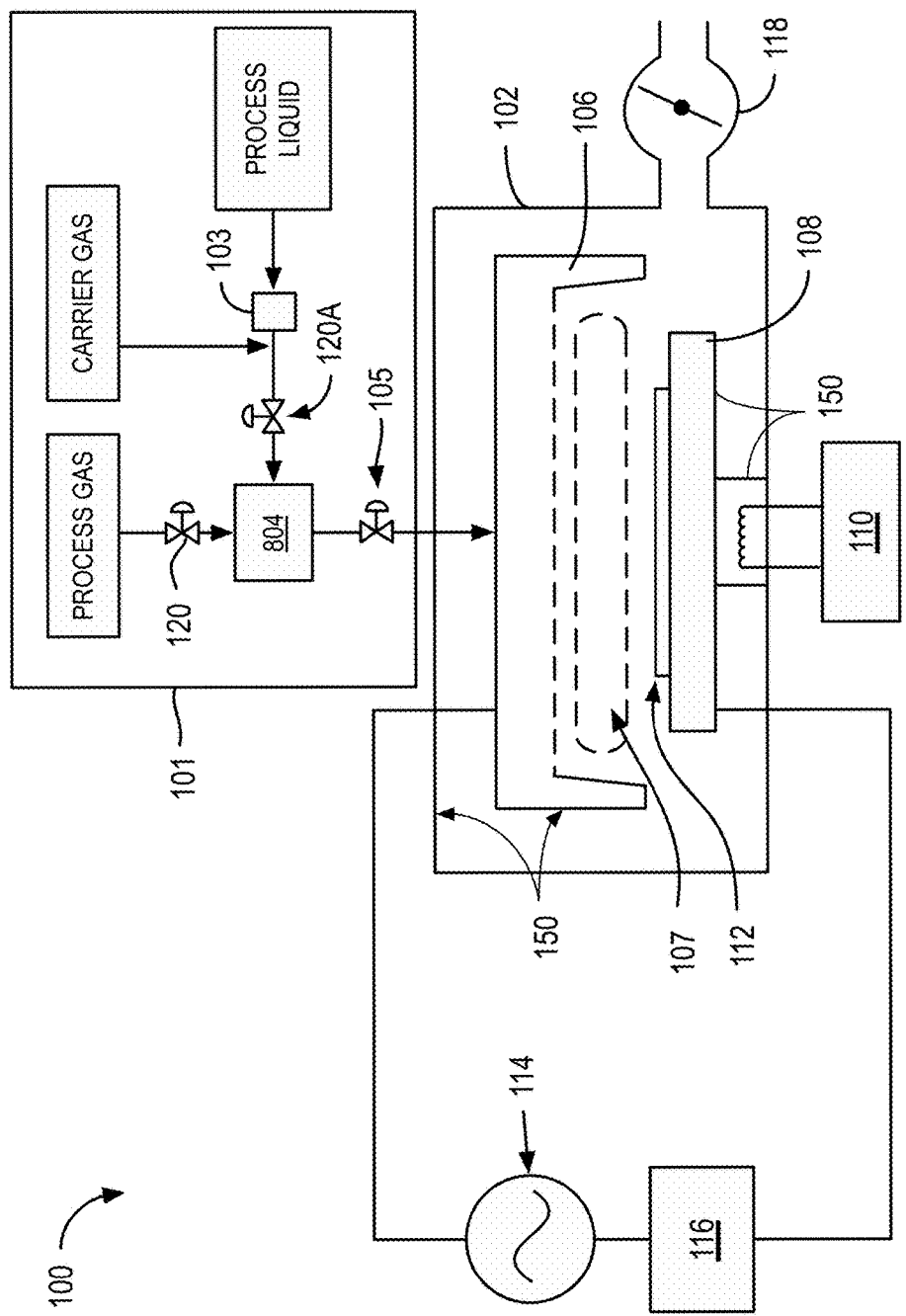
FIG. 1 is a cross-sectional schematic of a substrate processing apparatus having a processing chamber with a single process station.

In the following description, numerous specific details are set forth in order to provide a thorough understanding of the present invention. However, the present invention may be practiced without some or all of these specific details. In other instances, well known process operations have not been described in detail so as to not unnecessarily obscure the present invention. While the invention will be described in conjunction with specific detailed embodiments, it is to be understood that these specific detailed embodiments are not intended to limit the scope of the inventive concepts disclosed herein.

Disclosed herein are methods and apparatuses for suppressing parasitic plasma generation in semiconductor substrate processing chambers which are used to deposit conformal films via atomic layer deposition (ALD).

ALD is used to deposit films of material having a desired thickness by performing multiple "ALD cycles," each of which deposits only a thin layer of material (oftentimes only one molecular layer thick). As described in detail below, a basic ALD cycle for depositing a single layer of material on a substrate in a processing chamber may include: (i) adsorbing a film precursor onto a substrate such that it forms an adsorption-limited layer, (ii) removing (at least some) unadsorbed film precursor from the volume surrounding the adsorbed precursor, and (iii) after removing unadsorbed precursor, reacting the adsorbed film precursor to form a layer of film on the substrate. Oftentimes, an ALD cycle additionally involves an operation of (iv) removing desorbed film precursor and/or reaction by-product from the volume surrounding the layer of film formed on the substrate.

The removing in operations (ii) and (iv) may be done via purging, evacuating by pumping down to a base pressure ("pump-to-base"), etc. the volume surrounding the substrate. In some embodiments, these purges may be logically divided into what is referred to herein as a "primary purge" or "burst purge" and a "secondary purge." The primary purge involves the use of what is referred to herein as a "primary purge gas" originating from a "primary purge gas source" and introduced into the processing chamber via a primary purge gas flow path through one or more primary purge gas inlets. Likewise, the secondary purge involves the use of what is referred to herein as a "secondary purge gas" originating from a "secondary purge gas source" and introduced into the processing chamber via a secondary purge gas flow path through one or more secondary purge gas inlets.

The primary purge generally occurs during operation (ii), and in embodiments where there is another purge in operation (iv), during that purge as well. However, the primary purge generally does not occur during operations (i) and (iii), and in some embodiments, substantially all primary purge gas may be removed from the processing chamber prior to the reacting in operation (iii). Hence, since flow of the primary purge gas is intermittent, the primary purge is also referred to herein as a "burst purge" (employing a "burst purge gas"). The phrases primary purge and burst purge are used synonymously herein.

What is referred to herein as the "secondary purge" may be viewed as distinct from the "primary purge." In contrast to the primary purge, during the secondary purge gas may be flowed into the processing chamber during the reaction occurring in operation (iii) in a manner such that it does not substantially disrupt or interfere with the reactive process occurring on the substrate surface. In some embodiments, the secondary purge gas may also be flowed to the processing chamber during operations (i)-(ii) and/or (iv), and in certain such embodiments, continuously flowed to the processing chamber throughout operations (i)-(iv).

The flow rate of secondary purge gas into the process chamber may be different than the flow rate of primary purge gas into the process chamber, depending on the embodiment. In some embodiments, the primary purge gas may be flowed into the process chamber at a rate of about 1,000 to 100,000 sccm, or more preferably about 5,000 to 45,000 sccm, or even about 10,000 to 30,000 sccm. In some embodiments, the secondary purge gas may be flowed into the process chamber at a rate of about 1 to 50,000 sccm, or more preferably about 1 to 30,000 sccm, or even about 1,000 to 20,000 sccm.

The use of a secondary purge in ALD processes may have several beneficial effects relating to the secondary purge being active during operation (iii) and also to the secondary purge gas being directed to remote areas of the processing chamber rather than directly at the substrate (as with the primary purge). Flow of the secondary purge gas to remote areas of the chamber—i.e., regions not in the immediate vicinity of the substrate surface-helps to remove excess unadsorbed film precursor from the processing chamber and, moreover, may even help to prevent film precursor from flowing to these remote regions of the chamber in the first instance. To effect the latter, secondary purge would then also be active during operation (i) wherein film precursor is flowed to the chamber. The secondary purge's employment during operation (iii) protects the interior surfaces of the chamber, for example, from any spurious deposition which might occur as a result of precursor becoming desorbed from the substrate surface during the reactive process occurring there, and then becoming re-adsorbed and reacting elsewhere, such as on the chamber sidewalls. Before describing detailed examples of substrate processing apparatuses equipped to employ a secondary purge, a general overview of film deposition apparatuses is now provided.

Overview of Film Deposition Apparatuses

Operations for depositing films on semiconductor substrates may generally be performed in a substrate processing apparatus like that shown in FIG. 1. The apparatus 100 of FIG. 1, which will be described in greater detail below, has a single processing chamber 102 with a single substrate holder 108 in an interior volume which may be maintained under vacuum by vacuum pump 118. Also fluidically coupled to the chamber for the delivery of (for example) film precursors, carrier and/or purge and/or process gases, secondary reactants, etc. is gas delivery system 101 and showerhead 106. Equipment for generating a plasma within the processing chamber is also shown in FIG. 1 and will be descried in further detail below. In any event, as it is described in detail below, the apparatus schematically illustrated in FIG. 1 provides the basic equipment for performing film deposition operations such as ALD on semiconductor substrates.

While in some circumstances an substrate processing apparatus like that of FIG. 1 may be sufficient, when time-consuming film deposition operations are involved, it may be advantageous to increase substrate processing throughput by performing multiple deposition operations in parallel on multiple semiconductor substrates simultaneously. For this purpose, a multi-station substrate processing apparatus may be employed like that schematically illustrated in FIG. 2. The substrate processing apparatus 200 of FIG. 2, still employs a single substrate processing chamber 214, however, within the single interior volume defined by the walls of the processing chamber, are multiple substrate process stations, each of which may be used to perform processing operations on a substrate held in a wafer holder at that process station. In this particular embodiment, the multi-station substrate processing apparatus 200 is shown having 4 process stations 201, 202, 203, and 204. The apparatus also employs a substrate loading device, in this case substrate handler robot 226, for loading substrates at process stations 201 and 202, and a substrate transferring device, in this case substrate carousel 290, for transferring substrates between the various process stations 201, 202, 203, and 204. Other similar multi-station processing apparatuses may have more or fewer processing stations depending on the embodiment and, for instance, the desired level of parallel wafer processing, size/space constraints, cost constraints, etc. Also shown in FIG. 2, which will be described in greater detail below, is a controller 250 which also assist the goal of performing efficient substrate deposition operations involving primary and secondary purge gases in atomic layer deposition (ALD) operations.

Figure 2:
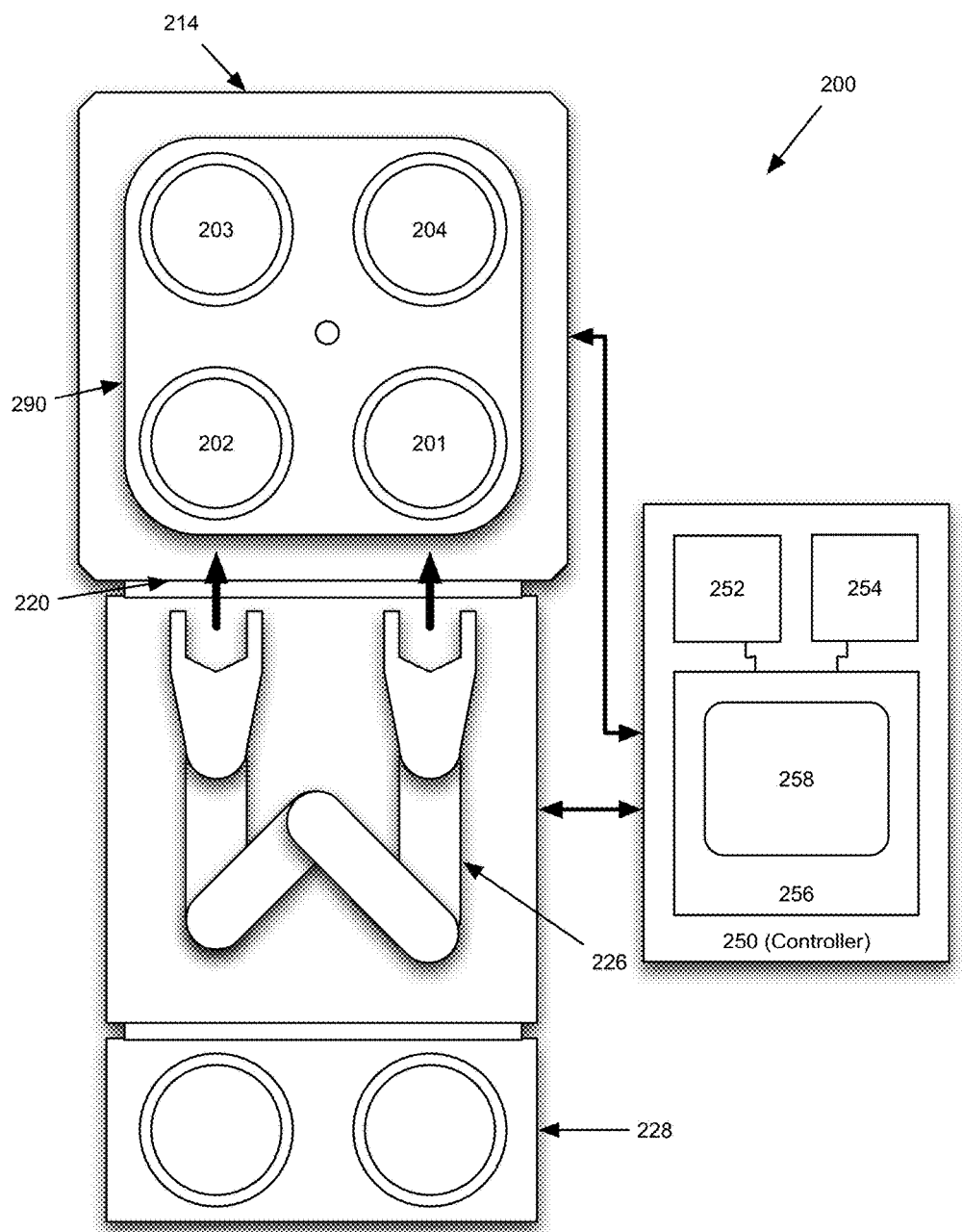
FIG. 2 is a schematic of a four-station substrate processing apparatus having a substrate handler robot for loading and unloading substrates from two process stations and a controlling for operating the apparatus.

Note that various efficiencies may be achieved through the use of a multi-station processing apparatus like that shown in FIG. 2 with respect to both equipment cost and operational expenses. For instance, a single vacuum pump (not shown in FIG. 2, but e.g. 118 in FIG. 1) may be used to create a single high-vacuum environment for all 4 process stations, may be used to evacuate spent process gases, etc. with respect to all 4 process stations. Depending on the embodiment, each process station may have its own dedicated showerhead for gas delivery (see, e.g., 106 in FIG. 1), but share the same gas delivery system (e.g., 101 in FIG. 1). Likewise, certain elements of the plasma generator equipment may be shared amongst process stations (e.g., power supplies), although depending on the embodiment, certain aspects may be process station-specific (for example, if showerheads are used to apply plasma-generating electrical potentials—see the discussion of FIG. 1 below). Once again, however, it is to be understood that such efficiencies may also be achieved to a greater or lesser extent by using more or fewer numbers of process stations per processing chamber such as 2, 3, 5, 6, 7, 8, 9, 10, 11, 12, 13, 14, 15, or 16, or more process stations per reaction chamber.

Implementation and Application of Secondary Purge

Substrate processing apparatuses employing a showerhead design may, in particular, benefit from the use of a secondary purge. In such designs, the main purpose of the showerhead is to provide the mechanism by which film precursor is introduced into the processing chamber for substrate surface adsorption in operation (i). The showerhead design allows a more spatially uniform distribution of film precursor flow relative to the substrate surface than would otherwise be achieved with just a few nozzles serving as point sources of flow. The showerhead may also, upon application of suitable electrical potential, serve as one of the two electrodes used for plasma generation in operation (iii) which results in activation of the surface reaction. In addition to these purposes, the showerhead may also be used to introduce the flow of primary purge gas to the processing chamber during operation (ii) and/or (iv) and in so doing, achieve better spatial uniformity with respect to the primary purge gas as well. However, an issue with this method of introducing purge gas into the processing chamber is that said flow does not typically effectively purge the cavity behind the showerhead. For this reason, a secondary purge gas flow directly into the space/cavity behind/above the showerhead may be quite beneficial in that it may minimize or prevent undesirable deposition at the backside of the showerhead and on chamber walls behind/above the showerhead, etc.

Figure 3:
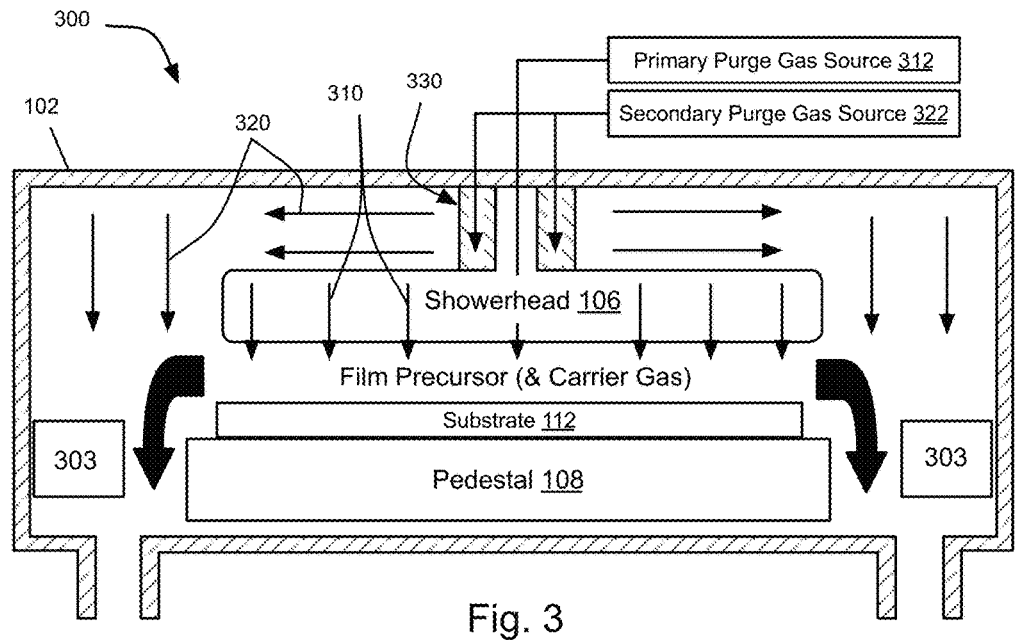
FIG. 3 is a cross-sectional schematic of a processing chamber of a single station substrate processing apparatus having a showerhead and showerhead collar, and featuring primary and secondary purge gas flow paths.

One such embodiment is schematically illustrated in FIG. 3. FIG. 3 presents a cross-sectional schematic of a single station substrate processing apparatus 300 having a processing chamber 102, a showerhead 106 and showerhead collar 330, and featuring primary and secondary purge gas flow paths, 310 and 320, respectively. In the configuration shown in FIG. 3, primary purge gas from primary purge gas source 312 is flowed into chamber 102 through showerhead 106, while secondary purge gas from secondary purge gas source 322 is flowed into chamber 102 through showerhead collar 330. Thus, the secondary purge gas here is introduced into the processing chamber 102 near to the center axis of the backside of the showerhead 106 and introduced with a flow substantially parallel to the plane of the substrate 112 held on pedestal 108. A secondary purge gas so introduced may also then flow around the showerhead and down the chamber sidewalls before exiting the chamber in the vicinity of cross-plates 303 (as schematically illustrated by the arrows in the figure). In this manner the secondary purge gas may minimize and/or prevent deposition on the interior walls of chamber 102. In some examples, the flow of purge gas in the cavity behind the showerhead satisfies a Peclet condition (typically a Peclet number greater than one) so that back diffusion (or flow) of precursor is prevented in said cavity which, as a result, reduces the effective chamber volume while minimizing unwanted deposition.

A further benefit to the use of a secondary purge gas implemented generally in accordance with FIG. 3 are the ability of the processing chamber build-up of chamber pressure using an inert gas instead of film precursor, which may be quite expensive. The higher chamber pressure may act as an air curtain for the film precursor and thus increases the partial pressure of precursor in the substrate region while reducing precursor partial pressure elsewhere. The higher chamber pressure itself also reduces spurious deposition on inner chamber surfaces/walls and also lowers the chance of (or strength of) parasitic plasma generation (to be discussed in greater detail below) due to the higher pressure regime.

Suitable showerheads and showerhead collars employable for generating primary and secondary purge gas flows similar to that which is schematically illustrated in FIG. 3 are described in greater detail below with respect to FIGS. 6-9. The use of such a secondary purge gas, its introduction at the backside of the showerhead, and details of associated apparatuses are also described in prior U.S. patent application Ser. No. 13/659,231, filed Oct. 24, 2012, titled "SUPPRESSION OF PARASITIC DEPOSITION IN A SUBSTRATE PROCESSING SYSTEM BY SUPPRESSING PRECURSOR FLOW AND PLASMA OUTSIDE OF SUBSTRATE REGION," published as US Pat. Pub. No. 2013/0344245 hereby incorporated by reference in its entirety and for all purposes.

Parasitic Plasma Suppression in Methods and Apparatuses Employing Secondary Purge Because the secondary purge is typically ongoing during the film-forming reactive operation of an ALD process (operation (iii) above), an inert gas is typically chosen as a secondary purge gas such that it will not interfere with the film-forming reaction. In previous work, $N_2$ was often chosen as the secondary purge gas. However, in certain applications, such as double-patterning, the nitrogen content of the deposited film must be critically controlled, and because use of $N_2$ as the secondary purge gas often leads to nitrogen incorporation into the deposited film, $N_2$ is often a poor choice.

This is illustrated in Table I below, which shows the compositions of 4 films deposited using 4 different combinations of primary/burst purge ("BP") gas, secondary purge ("$2^{nd}$ P") gas, and carrier gas. Silicon and oxygen content are listed as raw ion counts; nitrogen, hydrogen, and carbon content are listed as densities in counts per cubic cm. Film compositions were measured using secondary ion mass spectrometry ("SIMS"). The first line of the table shows a baseline film composition prepared using $N_2$ for primary purge gas, secondary purge gas, and carrier gas. Relative to this baseline composition, the second line of the table shows that a substitution of Ar for $N_2$ as both the primary/burst and secondary purge gases reduces nitrogen concentration in the deposited film by about 40% (scaled by Si ion count). The example listed on the third line of Table I then illustrates that that substitution of Ar as the primary/burst purge gas while retaining $N_2$ as the secondary purge gas does not yield a similar reduction in N concentration. Because the same nitrogen concentration reduction is not achieved using Ar solely for the primary/burst purge, one concludes that the selection of primary/burst purge gas does not have a significant effect on N concentration in the deposited film. This may be rationalized on the basis that no (or little) primary/burst purge gas is present in the processing chamber during the film-forming reactive step (operation (iii) above) for potential incorporation into the deposited film. The secondary purge gas, on the other hand, is typically present during the film forming reactive step (operation (iii)), and thus it does contribute chemical species to the deposited film. As an additional confirmation of this analysis, the final entry in Table I lists the film composition where Ar is used for both the primary/burst purge gas and the carrier gas. The fact that this does not lead to a reduction in N-content relative to the baseline composition confirms the analysis that it is the secondary purge gas which is the dominant nitrogen contributor to the deposited film.

top wall/ceiling of the processing chamber is rather sizeable, this plasma may be quite large volumetrically and, coupled to it having a high plasma density, it may draw a significant amount of power away from the main plasma used to activate the film-forming reaction on the substrate.

Formation of a parasitic plasma is thus undesirable for a variety of reasons: A parasitic plasma is an "uncontrolled" power sink, potentially drawing power from the main plasma and depressing its density. Moreover, since the density and power-draw of the parasitic plasma may vary based on a variety of factors, its affect on the main plasma (which activates the film forming reaction) may also be varying as well as unpredictable, and so may be a significant factor contributing to wafer-to-wafer variability. In addition, a parasitic plasma can result in enhanced deposition on chamber wall surfaces; said deposition may act as a source of particles contaminating the deposited film on the substrate. Thus, operation with a strong/dense parasitic plasma likely leads to long term issues with wafer-to-wafer repeatability, tool drift, process particle performance, increased erosion of showerhead components and/or other chamber components, and/or other productivity issues, and therefore, to prevent/minimize these undesirable consequences, the partial or complete suppression/elimination of parasitic plasma generation in an ALD process system is an important goal.

One approach to resolving this issue is to judiciously choose a secondary purge gas which does not easily form a strong plasma (or a plasma at all) and yet still does not interfere with the film-forming reaction (in operation (iii)) or

TABLE I

Composition SIMS Data Measured from Wafers Under Various Purge Conditions

| Splits | BP | $2^{nd}$ P | Carrier Gas | Si (raw ion #) | O (raw ion #) | N ($cm^{-3}$) | N (Normalized to Si ion count) | H ($cm^{-3}$) | C ($cm^{-3}$) |
|---|---|---|---|---|---|---|---|---|---|
| Cond 1 | $N_2$ | $N_2$ | $N_2$ | 1.86E+04 | 1.14E+05 | 6.11E+20 | 3.28E+16 | 2.74E+21 | 1.60E+20 |
| Cond 1 | Ar | Ar | $N_2$ | 1.72E+04 | 1.05E+05 | 3.37E+20 | 1.96E+16 | 3.83E+21 | 2.13E+20 |
| Cond 1 | Ar | $N_2$ | $N_2$ | 2.14E+04 | 1.29E+05 | 7.99E+20 | 3.73E+16 | 2.52E+21 | 3.69E+20 |
| Cond 1 | Ar | $N_2$ | Ar | 1.94E+04 | 1.20E+05 | 8.97E+20 | 4.62E+16 | 2.70E+21 | 2.87E+20 |

The foregoing SIMS experiments thus illustrate that use of argon (Ar) instead of $N_2$ as an inert secondary purge gas in ALD processes is effective for controlling/reducing N-content in the resulting deposited films. However, experiments with Ar have revealed that it too is less than ideal as a secondary purge gas, albeit for a different reason than $N_2$. Because the film-forming reaction in operation (iii) is typically plasma-activated, a plasma-generating RF field is typically present in the processing chamber during the secondary purge. Experiments have shown that this RF field, in addition to generating a "main plasma" in the vicinity of the substrate surface—the plasma that is used to activate the surface reaction of adsorbed film precursor—may also generate a "parasitic plasma" in a remote area of the chamber. For instance, in Implementations where a showerhead is used to dispense both film precursor and primary purge gas, and where a secondary purge gas is dispensed from above/behind the showerhead, such as is done in the embodiment shown in FIG. 3, it has been found that a strong/dense parasitic plasma is generated in the region of the process chamber behind/above the showerhead. This unintended plasma has been observed to be very bright and thus presumably very dense/strong. Moreover, because the volume of the region between the top of the showerhead and the alter the content of the film in an adverse manner. One such choice is molecular oxygen ($O_2$). When $O_2$ is used as the secondary purge gas along with Ar as the primary purge gas it has been found that the parasitic plasma generated behind the showerhead is much weaker than the parasitic plasma that would otherwise be generated when using Ar as both the primary and secondary purge gases.

Without being limited to a particular theory, it is thought that the reason for the comparative weakness of the parasitic plasma when $O_2$ is used relative to Ar is that an $O_2$-based plasma requires much higher levels of RF-power to sustain it relative to an Ar-based plasma. This is presumably due to the large disassociation energy associated with molecular oxygen-oxygen bonds as well as the high ionization energy associated with oxygen atoms. Thus, $O_2$-based plasmas have been found to have low electron densities for a given sustaining RF power relative to other types of plasmas (such as Ar-based plasmas), and thus one may generally referred to them as "weak plasmas." As such, in the plasma-activation step of the ALD cycle, the RF power and showerhead voltages used to generate/ignite an Ar plasma between the showerhead and the substrate are insufficient to generate/ignite an $O_2$ plasma in the cavity above the showerhead, or if there is some ignition, the $O_2$ plasma will be very weak (and visibly dim). With regards to the other characteristic of a preferred secondary purge gas, it is noted that unlike $N_2$, it has been found that not only is an $Ar/O_2$ mixture compatible with the typical plasma-activated ALD surface reaction, the presence of $O_2$ has been actually found to improve film quality (at least in some embodiments).

Numerical and experimental studies have been performed in order to detail and quantify, for a particular example, the extent to which RF power is drawn away from the main plasma by the presence of an Ar-based parasitic plasma, and the extent to which improvement may be achieved by using $O_2$ as the secondary purge gas.

Table II lists 5 different sets of process conditions consisting of various combinations of primary/burst and secondary purge gases and RF power levels. One wafer was processed according to each of the 5 listed sets of process conditions. The data shown in the table from left to right are RF power level in Watts, mean deposited film thickness in Angstroms (Å) (measured at 49 points over the surface of each wafer), NU % (percent thickness non-uniformity (1 standard deviation, scaled, again measured at 49 points on each wafer's surface), range of deposited film thicknesses (difference between thinnest and thickest points of the deposited film), NU % (R/2) (a statistical measurement—referred to as "half range nonuniformity"—which is defined as $\frac{1}{2}*(\max_{thickness}-\min_{thickness})/\text{mean}_{thickness}*100\%$), number of deposition cycles per process station (4 process stations were used), deposition rate per ALD cycle (e.g., 1.508 Å/cycle=349.8 Å/(58 cycles×4)), estimated power delivery level relative to using the primary/secondary purge combination of $N_2/N_2$, and the power loss percentage (again relative to use of $N_2/N_2$).

Figure 4:
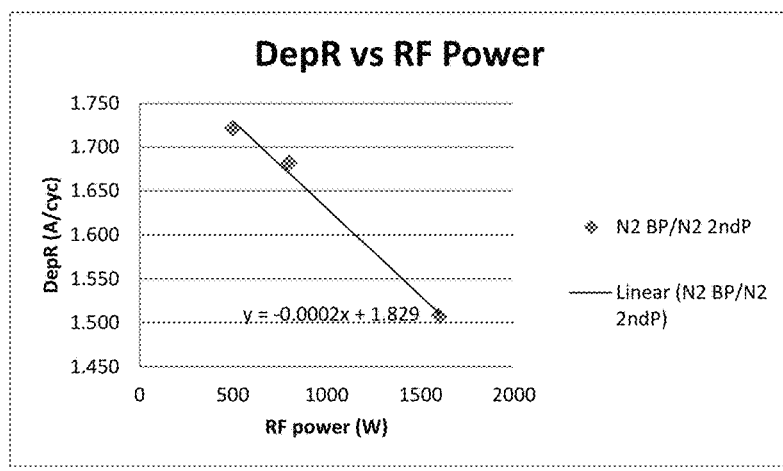
FIG. 4 is a plot of deposition rate versus RF power used to illustrate the presence and strength of a parasitic plasma formed in the processing chamber behind the showerhead.

The strategy embodied in Table II is to establish a quantitative relationship between deposition rate and RF power level in the absence of a parasitic plasma, and then to measure deposition rate again using Ar and $O_2$ as the secondary purge gases to estimate the extent to which power is lost to the presence of a parasitic plasma. Thus, the first 3 entries in Table II correspond to experiments where $N_2$ was used for both the primary and secondary purge gas while RF power level was varied between the 3 entries. These 3 data points are then plotted in FIG. 4—deposition rate ("DepR") versus RF power level—and a calculated best-fit line is displayed in the figure to show the relationship between dep rate and power.

The $4^{th}$ entry in Table II then shows the results of a deposition experiment where Ar is used as both the primary/burst purge and secondary purge gas. The table shows that the dep rate has increased to 1.66 Å/cycle at 1600 W from 1.508 Å/cycle obtained at 1600 W RF power using $N_2$. It was then estimated from the relationship in FIG. 4 that power loss is approximately 47% relative to using $N_2$. (Dep rate is inversely proportional to power level; see FIG. 4.)

Finally, the $5^{th}$ entry in Table II shows the effect of substituting $O_2$ for Ar as the secondary purge gas. The table shows that for this experiment the dep rate has dropped back to 1.545 Å/cycle at 1600 W, much closer to the dep rate using $N_2$. This corresponds to a power loss due to the presence of parasitic plasma of only 11% relative to $N_2$, a substantial improvement in comparison to the use of Ar.

Thus, it has been found that the use of molecular oxygen alleviates the issues discussed above to a great extent. In sum, the data and associated calculations show that the RF power consumed by the parasitic plasma may be close to 50% of the total RF power delivered to the processing station, whereas substitution of $O_2$ may reduce power losses to close to 10% (at least in this example). Generalizing the foregoing analysis, one may conclude that chemical species having large ionization and disassociation energies relative to the ionization energy of argon—or other species used to support the reaction activating plasma in operation (iii)—may be good candidates for use as a secondary purge gas. Of course, their presence/use must also be compatible with the film-forming reaction and desired characteristics of the deposited film (the case for $O_2$, but not for $N_2$). Table III summarizes the foregoing points:

TABLE III

| BP | $2^{nd}$ P | Carrier Gas | N-Content | Parasitic Plasma |
|---|---|---|---|---|
| $N_2$ | $N_2$ | $N_2$ | high | No |
| Ar | Ar | $N_2$ | low | Yes |

TABLE II

Estimated Main Plasma Power Loss Due to Parasitic Plasma

| Test Condition | RF Power (W) | Mean (A) | NU % | Range (A) | NU% (R/2) | Dep Cyc#/ STN | DepR (A/cyc) | Est. deliver power (relative to N2 BP/ N2 2ndP) | Power loss via parasitic plasma (relative to N2 BP/ N2 2ndP) |
|---|---|---|---|---|---|---|---|---|---|
| N2 BP/N2 $2^{nd}$ P 1600 W | 1600 | 349.8 | 0.95 | 9.62 | 1.38 | 58 | 1.508 | 1600 (100%) | 0 |
| N2 BP/N2 $2^{nd}$ P 800 W | 800 | 390.1 | 0.82 | 8.7 | 1.12 | 58 | 1.681 | 800 (100%) | 0 |
| N2 BP/N2 $2^{nd}$ P 500 W | 500 | 399.3 | 0.43 | 6.66 | 0.83 | 58 | 1.721 | 500 (100%) | 0 |
| Ar BP/Ar $2^{nd}$ P 1600 W | 1600 | 385.0 | 0.32 | 5.35 | 0.70 | 58 | 1.660 | 845 (53%) | ~47% |
| Ar BP/O2 $2^{nd}$ P 1600 W | 1600 | 385.5 | 0.95 | 12.96 | 1.81 | 58 | 1.545 | 1420 (89%) | ~11% |

TABLE III-continued

| BP | $2^{nd}$ P | Carrier Gas | N-Content | Parasitic Plasma |
|---|---|---|---|---|
| Ar | $N_2$ | $N_2$ | high | No |
| Ar | $N_2$ | Ar | high | No |
| Ar | O2 | Ar | low | No |

Detailed Description of Atomic Layer Deposition Techniques and Deposited Films

As discussed above, as devices sizes continue to shrink and ICs move to employing 3-D transistors and other 3-D structures, the ability to deposit a precise amount (thickness) of conformal film material—dielectrics in particular, but also various dopant-containing materials—has become increasingly important. Atomic layer deposition is one technique for accomplishing conformal film deposition that typically involves multiple cycles of deposition in order to achieve a desired thickness of film.

In contrast with chemical vapor deposition (CVD) process, where activated gas phase reactions are used to deposit films, ALD processes use surface-mediated deposition reactions to deposit films on a layer-by-layer basis. For instance, in one class of ALD processes, a first film precursor (P1) is introduced in a processing chamber in the gas phase, is exposed to a substrate, and is allowed to adsorb onto the surface of the substrate (typically at a population of surface active sites). Some molecules of P1 may form a condensed phase atop the substrate surface, including chemisorbed species and physisorbed molecules of P1. The volume surrounding the substrate surface is then evacuated to remove gas phase and physisorbed P1 so that only chemisorbed species remain. A second film precursor (P2) may then be introduced into the processing chamber so that some molecules of P2 adsorb to the substrate surface. The volume surrounding the substrate within the processing chamber may again be evacuated, this time to remove unbound P2. Subsequently, energy provided to the substrate (e.g., thermal or plasma energy) activates surface reactions between the adsorbed molecules of P1 and P2, forming a film layer. Finally, the volume surrounding the substrate is again evacuated to remove unreacted P1 and/or P2 and/or reaction by-product, if present, ending a single cycle of ALD.

ALD techniques for depositing conformal films having a variety of chemistries—and also many variations on the basic ALD process sequence—are described in detail in U.S. patent application Ser. No. 13/084,399, filed Apr. 11, 2011, titled "PLASMA ACTIVATED CONFORMAL FILM DEPOSITION", U.S. patent application Ser. No. 13/242,084, filed Sep. 23, 2011, titled "PLASMA ACTIVATED CONFORMAL DIELECTRIC FILM DEPOSITION," now U.S. Pat. No. 8,637,411, U.S. patent application Ser. No. 13/224,240, filed Sep. 1, 2011, titled "PLASMA ACTIVATED CONFORMAL DIELECTRIC FILM DEPOSITION", and U.S. patent application Ser. No. 13/607,386, filed Sep. 7, 2012, titled "CONFORMAL DOPING VIA PLASMA ACTIVATED ATOMIC LAYER DEPOSITION AND CONFORMAL FILM DEPOSITION", each of which is incorporated by reference herein in its entirety for all purposes. As described in these prior applications, a basic ALD cycle for depositing a single layer of material on a substrate may include: (i) adsorbing a film precursor onto a substrate such that it forms an adsorption-limited layer, (ii) removing unadsorbed precursor from the volume surrounding the adsorbed precursor, (iii) reacting the adsorbed-precursor to form a layer of film on the substrate, and (iv) removing desorbed film precursor and/or reaction by-product from the volume surrounding the layer of film formed on the substrate. The removing in operations (ii) and (iv) may be done via purging, evacuating, pumping down to a base pressure ("pump-to-base"), etc. the volume surrounding the substrate. It is noted that this basic ALD sequence of operations (I) through (iv) doesn't necessary involve two chemiadsorbed reactive species P1 and P2 as in the example described above, nor does it even necessarily involve a second reactive species, although these possibilities/options may be employed, depending on the desired deposition chemistries involved.

Due to the adsorption-limited nature of ALD, however, a single cycle of ALD only deposits a thin film of material, and oftentimes only a single monolayer of material. For example, depending on the exposure time of the film precursor dosing operations and the sticking coefficients of the film precursors (to the substrate surface), each ALD cycle may deposit a film layer only about 0.5 to 3 Angstroms thick.

Thus, the sequence of operations in a typical ALD cycle-operations (i) through (iv) just described—are generally repeated multiple times in order to form a conformal film of the desired thickness. Thus, in some embodiments, operations (I) through (iv) are repeated consecutively at least 1 time, or at least 2 times, or at least 3 times, or at least 5 times, or at least 7 times, or at least 10 times in a row. An ALD film may be deposited at a rate of about or between 0.1 Å and 2.5 Å per ALD cycle, or about or between 0.2 Å and 2.0 Å per ALD cycle, or about or between 0.3 Å and 1.8 Å per ALD cycle, or about or between 0.5 Å and 1.5 Å per ALD cycle, or about or between 0.1 Å and 1.5 Å per ALD cycle, or about or between 0.2 Å and 1.0 Å per ALD cycle, or about or between 0.3 Å and 1.0 Å per ALD cycle, or about or between 0.5 Å and 1.0 Å per ALD cycle.

In some film forming chemistries, an auxiliary reactant or co-reactant—in addition to what is referred to as the "film precursor"—may also be employed. In certain such embodiments, the auxiliary reactant or co-reactant may be flowed continuously during a subset of steps (i) through (iv) or throughout each of steps (i) through (iv) as they are repeated. In some embodiments, this other reactive chemical species (auxiliary reactant, co-reactant, etc.) may be adsorbed onto the substrate surface with the film precursor prior to its reaction with the film precursor (as in the example involving precursors P1 and P2 described above), however, in other embodiments, it may react with the adsorbed film precursor as it contacts it without prior adsorption onto the surface of the substrate, per se. Also, in some embodiments, operation (iii) of reacting the adsorbed film precursor may involve contacting the adsorbed film precursor with a plasma. The plasma may provide energy to drive the film-forming reaction on the substrate surface. In certain such embodiments, the plasma may be an oxidative plasma generated in the reaction chamber with application of suitable RF power (although in some embodiments, it may be generated remotely). In other embodiments, instead of an oxidative plasma, an inert plasma may be used. The oxidizing plasma may be formed from one or more oxidants such as $O_2$, $N_2O$, or $CO_2$, and may optionally include one or more diluents such as Ar, $N_2$, or He. In one embodiment, the oxidizing plasma is formed from $O_2$ and Ar. A suitable inert plasma may be formed from one or more inert gases such as He or Ar. Further variations on ALD processes are described in detail in the prior patent applications just cited (and which are incorporated by reference).

Figure 5:
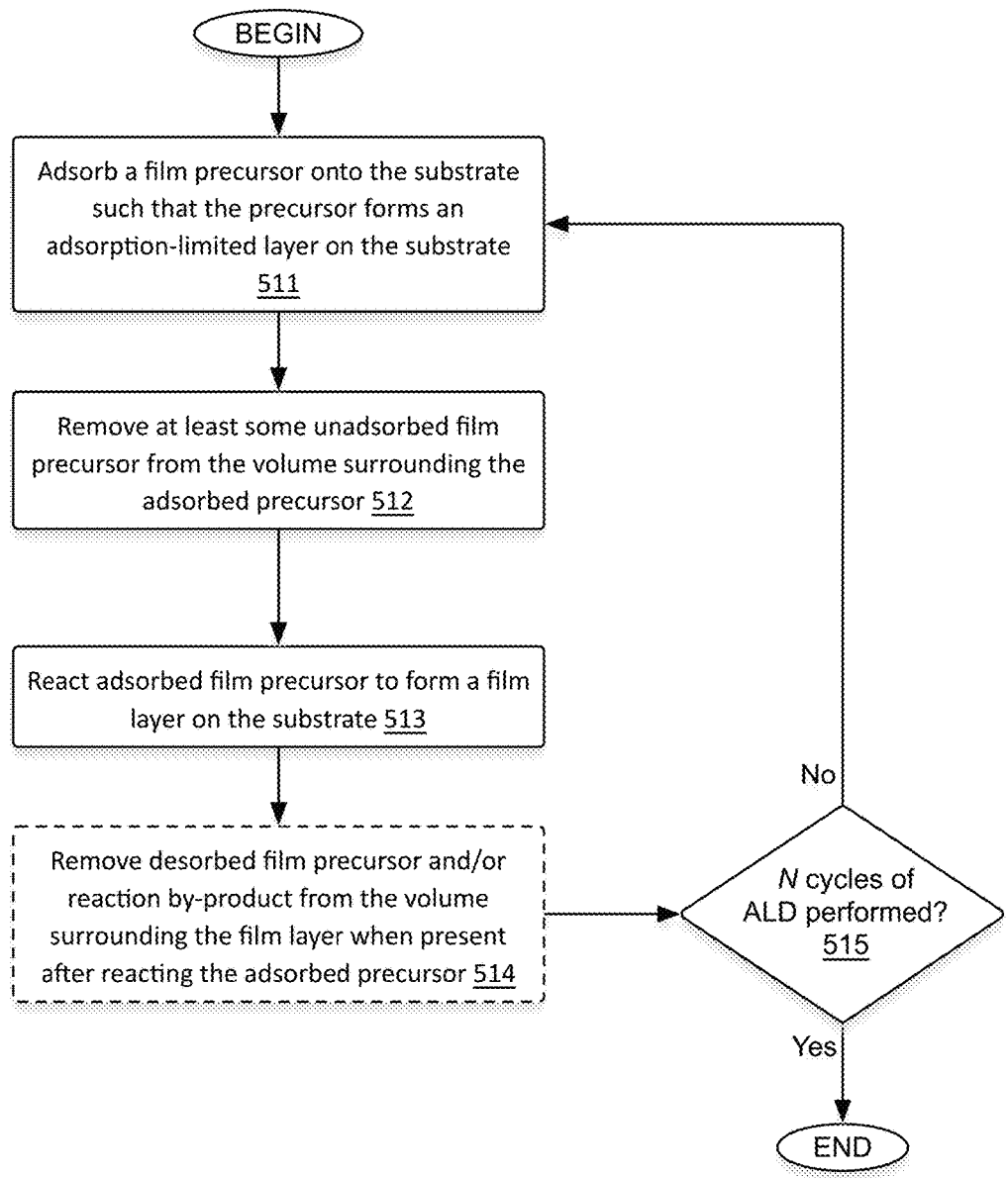
FIG. 5 is a flowchart of an example sequence of operations for forming a film of material on a substrate via an ALD process.

Accordingly, a basic sequence of operations for forming layers of film material on a substrate via an ALD process is schematically illustrated by the flowchart in FIG. 5. As shown in the figure, an ALD process for forming a single layer of film on a substrate may begin with an operation 511 of adsorbing a film precursor onto the substrate such that the precursor forms an adsorption-limited layer on the substrate, followed by an operation 512 of removing at least some unadsorbed film precursor from the volume surrounding the adsorbed precursor. Thereafter, in an operation 513, the adsorbed film precursor is reacted to form a film layer on the substrate. Finally, in some embodiments (as indicated by the dashed-line-drawn box in FIG. 5) and depending on the chemistry of the film-forming reaction, operation 513 may be followed by an operation 514 to remove desorbed film precursor and/or reaction byproduct from the volume surrounding the film layer when present after reacting the adsorbed precursor in operation 513.

The foregoing sequence of operations 511 through 514 represent a single ALD cycle resulting in the formation of a single layer of film. However, since an single layer of film formed via ALD is typically very thin-often it is only a single molecule thick-multiple ALD cycles are repeated in sequence to build up a film of appreciable thickness. Thus, referring again to FIG. 5, if it is desired that a film of say N layers be deposited (or, equivalently, one might say N layers of film), then multiple ALD cycles (operations 511 to 514) are repeated in sequence and after each ALD cycle concludes with operation 514, in operation 515, it is determined whether N cycles of ALD have been performed. Then, if N cycles have been performed, the film-forming operations conclude, whereas if not, the process sequence returns to operation 511 to begin another cycle of ALD.

In some embodiments, a multi-layer deposited film may include regions/portions of alternating composition formed, for example, by conformally depositing multiple layers sequentially having one composition, and then conformally depositing multiple layers sequentially having another composition, and then potentially repeating and alternating these two sequences. Some of these aspects of deposited ALD films are described, for example, in U.S. patent application Ser. No. 13/607,386, filed Sep. 7, 2012, and titled "CONFORMAL DOPING VIA PLASMA ACTIVATED ATOMIC LAYER DEPOSITION AND CONFORMAL FILM DEPOSITION", which is incorporated by reference herein in its entirety for all purposes. Further examples of conformal films having portions of alternating composition-including films used for doping an underlying target IC structure or substrate region—as well as methods of forming these films, are described in detail in: U.S. patent application Ser. No. 13/084,399, filed Apr. 11, 2011, and titled "PLASMA ACTIVATED CONFORMAL FILM DEPOSITION"; U.S. patent application Ser. No. 13/242,084, filed Sep. 23, 2011, and titled "PLASMA ACTIVATED CONFORMAL DIELECTRIC FILM DEPOSITION," now U.S. Pat. No. 8,637,411; U.S. patent application Ser. No. 13/224,240, filed Sep. 1, 2011, and titled "PLASMA ACTIVATED CONFORMAL DIELECTRIC FILM DEPOSITION"; U.S. patent application Ser. No. 13/607,386, filed Sep. 7, 2012, and titled "CONFORMAL DOPING VIA PLASMA ACTIVATED ATOMIC LAYER DEPOSITION AND CONFORMAL FILM DEPOSITION"; and U.S. patent application Ser. No. 14/194,549, filed Feb. 28, 2014, and titled "CAPPED ALD FILMS FOR DOPING FIN-SHAPED CHANNEL REGIONS OF 3-D IC TRANSISTORS"; each of which is incorporated by reference herein in its entirety for all purposes.

As detailed in the above referenced specifications, ALD processes are oftentimes used to deposit conformal silicon oxide films (SiOx), however ALD processes may also be used to deposit conformal dielectric films of other chemistries as also disclosed in the foregoing incorporated specifications. ALD-formed dielectric films may, in some embodiments, contain a silicon carbide (SIC) material, a silicon nitride (SIN) material, a silicon carbonitride (SICN) material, or a combination thereof. Silicon-carbon-oxides and silicon-carbon-oxynitrides, and silicon-carbon-nitrides may also be formed in some embodiment ALD-formed films. Methods, techniques, and operations for depositing these types of films are described in detail in U.S. patent application Ser. No. 13/494,836, filed Jun. 12, 2012, titled "REMOTE PLASMA BASED DEPOSITION OF SiOC CLASS OF FILMS,"; U.S. patent application Ser. No. 13/907,699, filed May 31, 2013, titled "METHOD TO OBTAIN SiC CLASS OF FILMS OF DESIRED COMPOSITION AND FILM PROPERTIES,"; U.S. patent application Ser. No. 14/062,648, titled "GROUND STATE HYDROGEN RADICAL SOURCES FOR CHEMICAL VAPOR DEPOSITION OF SILICON-CARBON-CONTAINING FILMS"; and U.S. patent application Ser. No. 14/194,549, filed Feb. 28, 2014, and titled "CAPPED ALD FILMS FOR DOPING FIN-SHAPED CHANNEL REGIONS OF 3-D IC TRANSISTORS"; each of which is hereby incorporated by reference in its entirety and for all purposes.

Other examples of film deposition via ALD include chemistries for depositing dopant-containing films as described in the patent applications listed and incorporated by reference above (U.S. patent application Ser. Nos. 13/084,399, 13/242,084, 13/224,240, and Ser. No. 14/194,549). As described therein, various dopant-containing film precursors may be used for forming the dopant-containing films, such as films of boron-doped silicate glass (BSG), phosphorous-doped silicate glass (PSG), boron phosphorus doped silicate glass (BPSG), arsenic (As) doped silicate glass (ASG), and the like. The dopant-containing films may include $B_2O_3$, $B_2O$, $P_2O_5$, $P_2O_3$, $As_2O_3$, $As_2O_5$, and the like. Thus, dopant-containing films having dopants other than boron are feasible. Examples include gallium, phosphorous, or arsenic dopants, or other elements appropriate for doping a semiconductor substrate, such as other valence III and V elements.

As for ALD process conditions, ALD processes may be performed at various temperatures. In some embodiments, suitable temperatures within an ALD reaction chamber may range from between about 25° C. and 450° C., or between about 50° C. and 300° C., or between about 20° C. and 400° C., or between about 200° C. and 400° C., or between about 100° C. and 350° C.

Likewise, ALD processes may be performed at various ALD reaction chamber pressures. In some embodiments, suitable pressures within the reaction chamber may range from between about 10 mTorr and 10 Torr, or between about 20 mTorr and 8 Torr, or between about 50 mTorr and 5 Torr, or between about 100 mTorr and 2 Torr.

Various RF power levels may be employed to generate a plasma if used in operation (iii). In some embodiments, suitable RF power may range from between about 100 W and 10 kW, or between about 200 W and 6 kW, or between about 500 W, and 3 kW, or between about 1 kW and 2 kW.

Various film precursor flow rates may be employed in operation (i). In some embodiments, suitable flow rates may range from about or between 0.1 mL/min to 10 mL/min, or about or between 0.5 mL/min and 5 mL/min, or about or between 1 mL/min and 3 mL/min.

Various gas flow rates may be used in the various operations. In some embodiments, general gas flow rates may range from about or between 1 L/min and 20 L/min, or about or between 2 L/min and 10 L/min. For the optional inert purge steps in operations (ii) and (iv), an employed burst flow rate may range from about or between 20 L/min and 100 L/min, or about or between 40 L/min and 60 L/min.

Once again, in some embodiments, a pump-to-base step refers to pumping the reaction chamber to a base pressure by directly exposing it to one or more vacuum pumps. In some embodiments, the base pressure may typically be only a few milliTorr (e.g., between about 1 and 20 mTorr). Furthermore, as indicated above, a pump-to-base step may or may not be accompanied by an inert purge, and thus carrier gases may or may not be flowing when one or more valves open up the conductance path to the vacuum pump.

Also, once again, multiple ALD cycles may be repeated to build up stacks of conformal layers. In some embodiments, each layer may have substantially the same composition whereas in other embodiments, sequentially ALD deposited layers may have differing compositions, or in certain such embodiments, the composition may alternate from layer to layer or there may be a repeating sequence of layers having different compositions, as described above. Thus, depending on the embodiment, certain stack engineering concepts, such as those disclosed in the patent applications listed and incorporated by reference above (U.S. patent application Ser. Nos. 13/084,399, 13/242,084, and Ser. No. 13/224,240) may be used to modulate boron, phosphorus, or arsenic concentration in these films.

Detailed Description of Substrate Processing Apparatuses

The methods described herein may be performed with any suitable semiconductor substrate processing apparatus. A suitable apparatus includes hardware for accomplishing the process operations and a system controller having instructions for controlling process operations in accordance with the various channel doping methodologies disclosed herein. In some embodiments, the hardware may include one or more process stations included in a multi-station substrate processing tool, and a controller having (or having access to) machine-readable instructions for controlling process operations in accordance with the processing techniques disclosed herein.

Thus, in some embodiments, an apparatus suitable for depositing films of material on multiple semiconductor substrates may include a first set of one or more process stations each having a substrate holder contained in a processing chamber, a second set of one or more process stations each having a substrate holder contained in the processing chamber, one or more valves for controlling flow of film precursor to the process stations, and one or more valve-operated vacuum sources for removing film precursor from the volumes surrounding the process stations contained in the processing chambers. And, such an apparatus may also include a controller having (or having access to) machine-readable instructions for operating the substrate loading device, the substrate transferring device, the one or more valves, and the vacuum source to deposit films of material onto the substrates.

Thus, in some embodiments, said instructions executed by the controller may include instructions for forming films on multiple substrates at multiple process stations contained in a processing chamber, wherein multiple layers of the film are formed on each substrate by a sequence of ALD cycles. Thus, in certain such embodiments, said instructions executed by the controller may include instructions for performing ALD operations (i) though (iv) as described above, and instructions for repeating ALD operations (i) through (iv) multiple times to form multiple layers of film on the multiple substrates at the multiple process stations of the substrate processing apparatus.

Accordingly, FIG. 1 schematically shows an embodiment of a substrate processing apparatus 100. For simplicity, processing apparatus 100 is depicted as a standalone process station having a process chamber body 102 for maintaining a low-pressure environment. However, it will be appreciated that a plurality of process stations may be included in a common process tool environment—e.g., within a common reaction chamber—as described herein. For example, FIG. 2 depicts an embodiment of a multi-station processing tool. Further, it will be appreciated that, in some embodiments, one or more hardware parameters of processing apparatus 100, including those discussed in detail above, may be adjusted programmatically by one or more system controllers.

Processing apparatus 100 fluidly communicates with reactant delivery system 101 for delivering process gases to a distribution showerhead 106. Reactant delivery system 101 includes a mixing vessel 804 for blending and/or conditioning process gases for delivery to showerhead 106. One or more mixing vessel inlet valves 120 may control introduction of process gases to mixing vessel 804.

Some reactants may be stored in liquid form prior to vaporization and subsequent delivery to the process chamber 102. The embodiment of FIG. 1 includes a vaporization point 103 for vaporizing liquid reactant to be supplied to mixing vessel 804. In some embodiments, vaporization point 103 may be a heated liquid injection module. In some embodiments, vaporization point 103 may be a heated vaporizer. The saturated reactant vapor produced from such modules/vaporizers may condense in downstream delivery piping when adequate controls are not in place (e.g., when no helium is used in vaporizing/atomizing the liquid reactant). Exposure of incompatible gases to the condensed reactant may create small particles. These small particles may clog piping, impede valve operation, contaminate substrates, etc. Some approaches to addressing these issues involve sweeping and/or evacuating the delivery piping to remove residual reactant. However, sweeping the delivery piping may increase process station cycle time, degrading process station throughput. Thus, in some embodiments, delivery piping downstream of vaporization point 103 may be heat treated. In some examples, mixing vessel 804 may also be heat treated. In one non-limiting example, piping downstream of vaporization point 103 has an increasing temperature profile extending from approximately 100° C. to approximately 150° C. at mixing vessel 804.

As mentioned, in some embodiments the vaporization point 103 may be a heated liquid injection module ("liquid injector" for short). Such a liquid injector may inject pulses of a liquid reactant into a carrier gas stream upstream of the mixing vessel. In one scenario, a liquid injector may vaporize reactant by flashing the liquid from a higher pressure to a lower pressure. In another scenario, a liquid injector may atomize the liquid into dispersed microdroplets that are subsequently vaporized in a heated delivery pipe. It will be appreciated that smaller droplets may vaporize faster than larger droplets, reducing a delay between liquid injection and complete vaporization. Faster vaporization may reduce a length of piping downstream from vaporization point 103. In one scenario, a liquid injector may be mounted directly to mixing vessel 804. In another scenario, a liquid injector may be mounted directly to showerhead 106.

In some embodiments, a liquid flow controller (LFC) upstream of vaporization point 103 may be provided for controlling a mass flow of liquid for vaporization and delivery to processing chamber 102. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, the LFC may be dynamically switched from a feedback control mode to a direct control mode by disabling a sense tube of the LFC and the PID controller.

Showerhead 106 distributes process gases and/or reactants (e.g., film precursors) toward substrate 112 at the process station, the flow of which is controlled by one or more valves upstream from the showerhead (e.g., valves 120, 120A, 105). In the embodiment shown in FIG. 1, substrate 112 is located beneath showerhead 106, and is shown resting on a pedestal 108. It will be appreciated that showerhead 106 may have any suitable shape; and may have any suitable number and arrangement of ports for distributing processes gases to substrate 112.

In some embodiments, a microvolume 107 is located beneath showerhead 106. Performing an ALD process in a microvolume in the process station near the substrate rather than in the entire volume of a processing chamber may reduce reactant exposure and sweep times, may reduce times for altering process conditions (e.g., pressure, temperature, etc.), may limit an exposure of process station robotics to process gases, etc. Example microvolume sizes include, but are not limited to, volumes between 0.1 liter and 2 liters.

In some embodiments, pedestal 108 may be raised or lowered to expose substrate 112 to microvolume 107 and/or to vary a volume of microvolume 107. For example, in a substrate transfer phase, pedestal 108 may be lowered to allow substrate 112 to be loaded onto pedestal 108. During a deposition on substrate process phase, pedestal 108 may be raised to position substrate 112 within microvolume 107. In some embodiments, microvolume 107 may completely enclose substrate 112 as well as a portion of pedestal 108 to create a region of high flow impedance during a deposition process.

Optionally, pedestal 108 may be lowered and/or raised during portions the deposition process to modulate process pressure, reactant concentration, etc. within microvolume 107. In one scenario where processing chamber body 102 remains at a base pressure during the process, lowering pedestal 108 may allow microvolume 107 to be evacuated. Example ratios of microvolume to process chamber volume include, but are not limited to, volume ratios between 1:500 and 1:10. It will be appreciated that, in some embodiments, pedestal height may be adjusted programmatically by a suitable system controller.

In another scenario, adjusting a height of pedestal 108 may allow a plasma density to be varied during plasma activation and/or treatment cycles included, for example, in an ALD or CVD process. At the conclusion of a deposition process phase, pedestal 108 may be lowered during another substrate transfer phase to allow removal of substrate 112 from pedestal 108.

While the example microvolume variations described herein refer to a height-adjustable pedestal, it will be appreciated that, in some embodiments, a position of showerhead 106 may be adjusted relative to pedestal 108 to vary a volume of microvolume 107. Further, it will be appreciated that a vertical position of pedestal 108 and/or showerhead 106 may be varied by any suitable mechanism within the scope of the present disclosure. In some embodiments, pedestal 108 may include a rotational axis for rotating an orientation of substrate 112. It will be appreciated that, in some embodiments, one or more of these example adjustments may be performed programmatically by one or more suitable system controllers having machine-readable instructions for performing all or a subset of the foregoing operations.

Returning to the embodiment shown in FIG. 1, showerhead 106 and pedestal 108 electrically communicate with RF power supply 114 and matching network 116 for powering a plasma. In some embodiments, the plasma energy may be controlled (e.g., via a system controller having appropriate machine-readable instructions) by controlling one or more of a process station pressure, a gas concentration, an RF source power, an RF source frequency, and a plasma power pulse timing. For example, RF power supply 114 and matching network 116 may be operated at any suitable power to form a plasma having a desired composition of radical species. Examples of suitable powers are included above. Likewise, RF power supply 114 may provide RF power of any suitable frequency. In some embodiments, RF power supply 114 may be configured to control high- and low-frequency RF power sources independently of one another. Example low-frequency RF frequencies may include, but are not limited to, frequencies between 50 kHz and 500 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy (OES) sensors. In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, the plasma may be controlled via input/output control (IOC) sequencing instructions. In one example, the instructions for setting plasma conditions for a plasma activation phase may be included in a corresponding plasma activation recipe phase of a process recipe. In some cases, process recipe phases may be sequentially arranged, so that all instructions for a process phase are executed concurrently with that process phase. In some embodiments, instructions for setting one or more plasma parameters may be included in a recipe phase preceding a plasma process phase. For example, a first recipe phase may include instructions for setting a flow rate of an inert (e.g., helium) and/or a reactant gas, instructions for setting a plasma generator to a power set point, and time delay instructions for the first recipe phase. A second, subsequent recipe phase may include instructions for enabling the plasma generator and time delay instructions for the second recipe phase. A third recipe phase may include instructions for disabling the plasma generator and time delay instructions for the third recipe phase. It will be appreciated that these recipe phases may be further subdivided and/or iterated in any suitable way within the scope of the present disclosure.

In some deposition processes, plasma strikes last on the order of a few seconds or more in duration. In certain implementations described herein, much shorter plasma strikes may be applied during a processing cycle. These may be on the order of 50 milliseconds to 1 second, with 0.25 seconds being a specific example. Such short RF plasma strikes require quick stabilization of the plasma. To accomplish this, the plasma generator may be configured such that the impedance match is preset to a particular voltage, while the frequency is allowed to float. Conventionally, high-frequency plasmas are generated at an RF frequency at about 13.56 MHz. In various embodiments disclosed herein, the frequency is allowed to float to a value that is different from this standard value. By permitting the frequency to float while fixing the impedance match to a predetermined voltage, the plasma can stabilize much more quickly, a result which may be important when using the very short plasma strikes associated with ALD cycles.

In some embodiments, pedestal 108 may be temperature controlled via heater 110. Further, in some embodiments, pressure control for processing apparatus 100 may be provided by one or more valve-operated vacuum sources such as butterfly valve 118. As shown in the embodiment of FIG. 1, butterfly valve 118 throttles a vacuum provided by a downstream vacuum pump (not shown). However, in some embodiments, pressure control of processing apparatus 100 may also be adjusted by varying a flow rate of one or more gases introduced to processing chamber 102. In some embodiments, the one or more valve-operated vacuum sources-such as butterfly valve 118—may be used for removing film precursor from the volumes surrounding the process stations during the appropriate ALD operational phases.

As described above, one or more process stations may be included in a multi-station substrate processing tool. FIG. 2 schematically illustrates an example of a multi-station processing tool 200 which includes a plurality of process stations 201, 202, 203, 204 in a common low-pressure processing chamber 214. By maintaining each station in a low-pressure environment, defects caused by vacuum breaks between film deposition processes may be avoided.

As shown in FIG. 2, the multi-station processing tool 200 has a substrate loading port 220, and a substrate handler robot 226 configured to move substrates from a cassette loaded from a pod 228, through substrate loading port 220, into the processing chamber 214, and finally onto a process station. Specifically, in this case, the substrate handler robot 226 loads substrates at process stations 201 and 202, and a substrate transferring device, in this case substrate carousel 290, transfers substrates between the various process stations 201, 202, 203, and 204. In the embodiment shown in FIG. 2, the substrate loading device is depicted as substrate handler robot 226 having 2 arms for substrate manipulation, and so, as depicted, it could load substrates at both stations 201 and 202 (perhaps simultaneously, or perhaps sequentially). Then, after loading at stations 201 and 202, the substrate transferring device, carousel 290 depicted in FIG. 2, can do a 180 degree rotation (about its central axis, which is substantially perpendicular to the plane of the substrates (coming out of the page), and substantially equidistant between the substrates) to transfer the two substrates from stations 201 and 202 to stations 203 and 204. At this point, handler robot 226 can load 2 new substrates at stations 201 and 202, completing the loading process. To unload, these steps can be reversed, except that if multiple sets of 4 wafers are to be processed, each unloading of 2 substrates by handler robot 226 would be accompanied by the loading of 2 new substrates prior to rotating the transferring carousel 290 by 180 degrees. Analogously, a one-armed handler robot configured to place substrates at just 1 station, say 201, would be used in a 4 step load process accompanied by 4 rotations of carousel 290 by 90 degrees to load substrates at all 4 stations.

The depicted processing chamber 214 shown in FIG. 2 provides four process stations, 201, 202, 203, and 204. Each station has a heated pedestal (e.g., see pedestal 108 in FIG. 3) and gas line inlets. It will be appreciated that in some embodiments, each process station may have different or multiple purposes. For example, in some embodiments, a process station may be switchable between an ALD process mode and a CVD process mode. Additionally or alternatively, in some embodiments, processing chamber 214 may include one or more matched pairs of ALD/CVD process stations. While the depicted processing chamber 214 comprises 4 process stations, it will be understood that a processing chamber according to the present disclosure may have any suitable number of stations. For example, in some embodiments, a processing chamber may have 1, or 2, or 3, or 4, or 5, or 6, or 7, or 8, or 9, or 10, or 11, or 12, or 13, or 14, or 15, or 16, or more process stations (or a set of embodiments may be described as having a number of process stations per reaction chamber within a range defined by any pair of the foregoing values, such as having 2 to 6 process stations per reaction chamber, or 4 to 8 process stations per reaction chamber, or 8 to 16 process stations per reaction chamber, etc.).

As indicated above, FIG. 2 depicts an embodiment of a substrate transferring device 290 for transferring substrates between process stations 201, 202, 203, and 204 within processing chamber 214. It will be appreciated that any suitable substrate transferring device may be employed. Non-limiting examples include wafer carousels and substrate handler robots.

Detailed Description of Showerheads and Showerhead Collars

Figure 6:
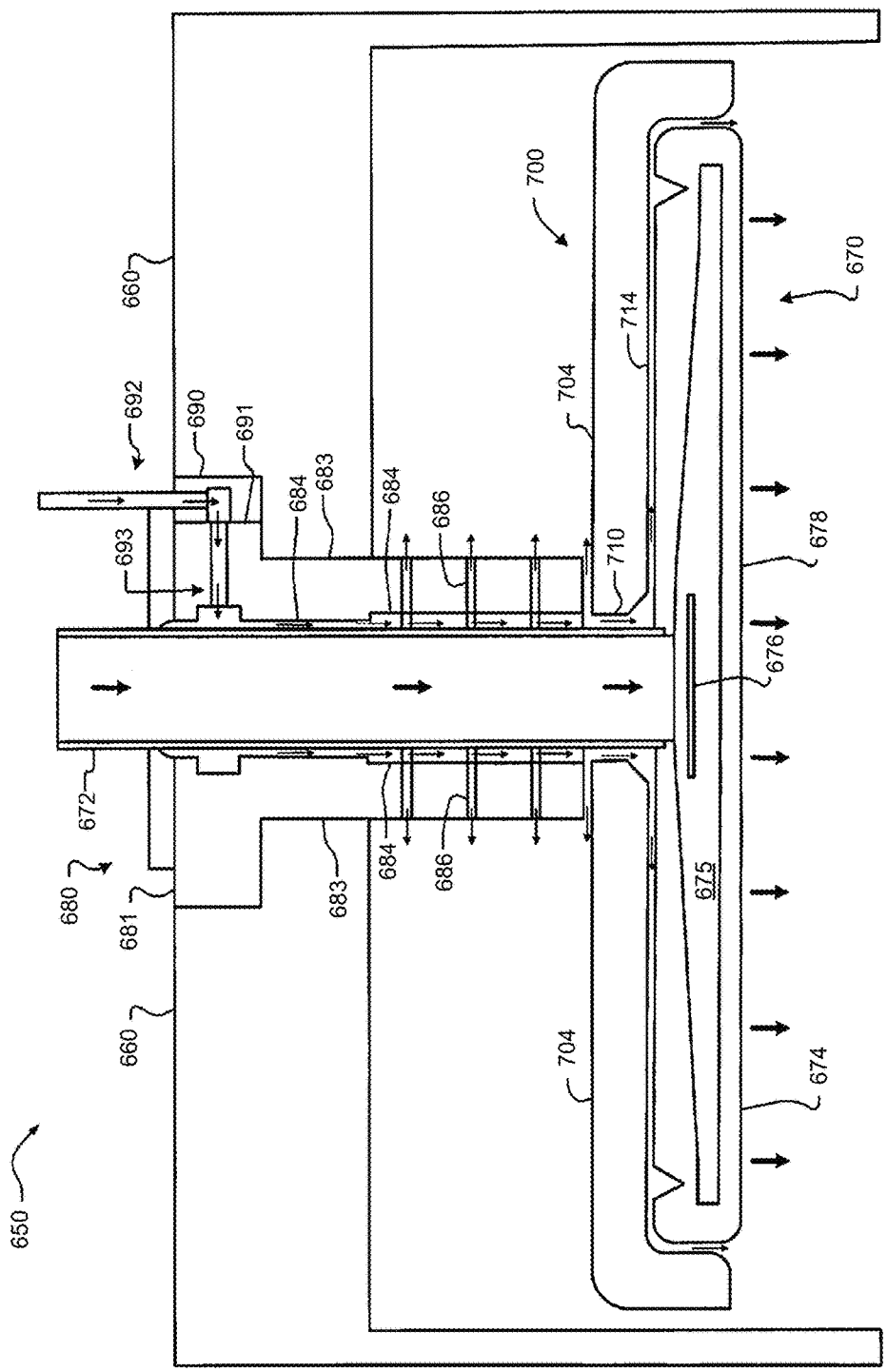
FIG. 6 is a more detailed cross-sectional view of a showerhead and showerhead collar in a substrate processing chamber also illustrating primary and secondary purge flow paths.

In ALD processes, the film precursor needs to be alternatively present in the reaction chamber and then evacuated. To prevent parasitic deposition, the excess precursor in the processing chamber is removed from the processing chamber and the shared precursor pathways (such as the stem of the showerhead) before introducing the next precursor. The removal of excess precursor is usually done by purging the delivery pathway and chamber with inert gas. When using a chandelier-type showerhead, however, the purge gas from the showerhead is not able to effectively remove the excess precursor trapped behind the showerhead. Therefore, the precursor can cause an appreciable amount of parasitic deposition on a back side of the showerhead, the top plate, and the processing chamber wall. It is not possible to fill the dead space with solid dielectric since that approach would likely cause RF coupling to ground. Hence, as described above, a secondary purge gas introduced from the backside of the showerhead may be employed to prevent such parasitic deposition. Hardware for implementing such a secondary purge will now be described in detail:

Referring now to FIG. 6, an example of a substrate processing system 650 including a processing chamber 660 having a showerhead 670 is shown. The showerhead 670 includes a stem portion 672 and a head portion 674. The head portion 674 defines an inner cavity 675. Fluids such as precursor or purge gas flow through the stem portion 672, onto a dispersion plate 676 and into the inner cavity 675. The fluids then pass through apertures/spaced holes 678 in a bottom surface of the head portion 674 and into the processing chamber.

The stem portion 672 of the showerhead 670 is connected to a top wall of the processing chamber 660 by a showerhead collar 680. The showerhead collar 680 has a generally "T"-shaped cross section and includes a head portion 681 and a stem portion 683. The showerhead collar 680 defines an inner cavity 684 that is cylinder-shaped and that receives the stem portion 672 of the showerhead 670. A plurality of slot-shaped apertures 686 are formed in the stem portion 683 to the secondary purge gas to flow from the inner cavity 684 to an outer surface of the stem portion 683. As is evident from the orientation of the slot-shaped apertures in FIG. 6 as well as the secondary purge flow lines 320 shown in FIG. 3, the secondary purge gas may be flowed into the process chamber in a direction substantially parallel to the plane of the substrate (although the flow direction changes in the vicinity of the chamber walls as shown in FIG. 3).

A fluid connector 690 may be connected to an edge of the head portion 681 of the showerhead collar 680 and is used to supply fluid such as purge gas. The fluid connector 690 includes one or more conduits and/or connectors that are generally identified at 692. The head portion 681 of the showerhead collar 680 likewise includes conduits and/or connectors that are generally identified at 693 to direct the flow of fluid to the inner cavity 684 of the showerhead collar 680.

A plate 700 is arranged between the head portion 674 of the showerhead 670 and the showerhead collar 680. The plate 700 includes an upper surface 704, a centering opening or bore 710, and a bottom surface 714. In some examples, the plate 700 is made of ceramic. A thickness of the plate 700 may be selected to minimize material and capacitive coupling to ground or parasitic plasma. The upper surface 704 of the plate 700 is spaced from a bottom edge of the showerhead collar 680 to allow fluid to pass there between. The centering bore 710 is also spaced from the stem portion 672 to allow fluid to pass there between. The bottom surface 714 of the plate is spaced from the upper surface of the showerhead 670 to allow fluid to flow there between. In some examples, the plate 700 may be omitted and the processing chamber may be operated without the plate 700.

Flowing the secondary purge gas through the collar inhibits deposition process chemistry from entering areas in the cavity to prevent unwanted film deposition there. Dimensions of the slots and other gaps may be selected to prevent plasma light-up therein and to allow for a Peclet condition to be satisfied to prevent back diffusion for the desired gas flow rates.

Referring now to FIG. 7, an example of the showerhead collar 680 is shown. The showerhead collar 680 includes the head portion 681 and the stem portion 683. The slots 686 may have an arcuate shape and may be arranged around the stem portion 683. The slots 686 allow fluid to flow from the inner cavity 684 through the slots 686. The head portion 681 may include a mating portion 718 that mates with a corresponding mating portion on the fluid connector 690. When connected, the conduit 693 of the showerhead collar 680 is aligned with the conduit 692 of the fluid connector 690.

Referring now to FIG. 8, an example of the fluid connector 690 for the showerhead collar 680 is shown. While the fluid connector 690 is shown to include a second mating portion 720, a conduit 730, a connector 732, a conduit 734, and a connector 736, other configurations of the fluid connector are contemplated.

Referring now to FIGS. 9A and 9B, examples of the plate 700 are shown. In FIG. 9A, the upper surface 704 of the plate 700 is shown to have a generally circular cross-section and a centering bore 710 arranged at a center of the plate 700. The centering bore 710 includes one or more projections 740 that extend radially inwardly from the centering tore 710. The projections 740 provide uniform spacing between the plate 700 and the stem portion 672. In FIG. 9B, the bottom surface 714 of the plate 700 is shown to include projections 744 that extend downwardly relative to a top of the processing chamber. The projections 744 provide uniform spacing between the bottom surface 714 of the plate 700 and the upper surface of the head portion 674 of the showerhead 670. It is also noted that RF isolation/suppression devices may reduce electric fields in the cavity behind the showerhead, which may also help to further reduce the chance or extent of parasitic plasma generation in the region behind the showerhead. For instance, the projections 740 and 744 may provide spacing that is sufficiently close to reduce parasitic plasma generation—for example if a spacing of approximately 3 mm or less is employed. Such a spacing, for typical process conditions, results in an insufficient space for plasma to form along with plasma sheaths (less than two plasma sheath lengths). Formation of plasma may be affected by plasma density, plasma electron temperature, and voltage across the sheath. Of course, as discussed in detail above, use of $O_2$ as the secondary purge gas also serves as an effective technique for preventing/minimizing parasitic plasma generation.

System Controllers

FIG. 2 also depicts an embodiment of a system controller 250 employed to control process conditions and hardware states of process tool 200 and its process stations. System controller 250 may include one or more memory devices 256, one or more mass storage devices 254, and one or more processors 252. Processor 252 may include one or more CPUs, ASICs, general-purpose computer(s) and/or specific purpose computer(s), one or more analog and/or digital input/output connection(s), one or more stepper motor controller board(s), etc.

In some embodiments, system controller 250 controls some or all of the operations of process tool 200 including the operations of its individual process stations. System controller 250 may execute machine-readable system control instructions 258 on processor 252—the system control instructions 258, in some embodiments, loaded into memory device 256 from mass storage device 254. System control instructions 258 may include instructions for controlling the timing, mixture of gaseous and liquid reactants, chamber and/or station pressure, chamber and/or station temperature, wafer temperature, target power levels, RF power levels, RF exposure time, substrate pedestal, chuck, and/or susceptor position, and other parameters of a particular process performed by process tool 200. These processes may include various types of processes including, but not limited to, processes related to deposition of film on substrates. System control instructions 258 may be configured in any suitable way. For example, various process tool component subroutines or control objects may be written to control operation of the process tool components necessary to carry out various process tool processes. System control instructions 258 may be coded in any suitable computer readable programming language. In some embodiments, system control instructions 258 are implemented in software, in other embodiments, the instructions may be implemented in hardware—for example, hard-coded as logic in an ASIC (application specific integrated circuit), or, in other embodiments, implemented as a combination of software and hardware.

In some embodiments, system control software 258 may include input/output control (IOC) sequencing instructions for controlling the various parameters described above. For example, each phase of a deposition process or processes may include one or more instructions for execution by system controller 250. The instructions for setting process conditions for a film deposition process phase, for example, may be included in a corresponding deposition recipe phase, and likewise for a capping film deposition phase. In some embodiments, the recipe phases may be sequentially arranged, so that all instructions for a process phase are executed concurrently with that process phase.

Other computer-readable instructions and/or programs stored on mass storage device 254 and/or memory device

256 associated with system controller 250 may be employed in some embodiments. Examples of programs or sections of programs include a substrate positioning program, a process gas control program, a pressure control program, a heater control program, and a plasma control program.

A substrate positioning program may include instructions for process tool components that are used to load the substrate onto pedestal 108 and to control the spacing between the substrate and other parts of process tool 200. The positioning program may include instructions for appropriately moving substrates in and out of the reaction chamber as necessary to deposit film on the substrates.

A process gas control program may include instructions for controlling gas composition and flow rates and optionally for flowing gas into the volumes surrounding one or more process stations prior to deposition in order to stabilize the pressure in these volumes. In some embodiments, the process gas control program may include instructions for introducing certain gases into the volume(s) surrounding the one or more process stations within a processing chamber during film deposition on substrates. The process gas control program may also include instructions to deliver these gases at the same rates, for the same durations, or at different rates and/or for different durations depending on the composition of the film being deposited. The process gas control program may also include instructions for atomizing/vaporizing a liquid reactant in the presence of helium or some other carrier gas in a heated injection module.

A pressure control program may include instructions for controlling the pressure in the process station by regulating, for example, a throttle valve in the exhaust system of the process station, a gas flow into the process station, etc. The pressure control program may include instructions for maintaining the same or different pressures during deposition of the various film types on the substrates.

A heater control program may include instructions for controlling the current to a heating unit that is used to heat the substrates. Alternatively or in addition, the heater control program may control delivery of a heat transfer gas (such as helium) to the substrate. The heater control program may include instructions for maintaining the same or different temperatures in the reaction chamber and/or volumes surrounding the process stations during deposition of the various film types on the substrates.

A plasma control program may include instructions for setting RF power levels, frequencies, and exposure times in one or more process stations in accordance with the embodiments herein. In some embodiments, the plasma control program may include instructions for using the same or different RF power levels and/or frequencies and/or exposure times during film deposition on the substrates.

In some embodiments, there may be a user interface associated with system controller 250. The user interface may include a display screen, graphical software displays of the apparatus and/or process conditions, and user input devices such as pointing devices, keyboards, touch screens, microphones, etc.

In some embodiments, parameters adjusted by system controller 250 may relate to process conditions. Non-limiting examples include process gas compositions and flow rates, temperatures, pressures, plasma conditions (such as RF bias power levels and exposure times), etc. These parameters may be provided to the user in the form of a recipe, which may be entered utilizing the user interface.

Signals for monitoring the processes may be provided by analog and/or digital input connections of system controller 250 from various process tool sensors. The signals for controlling the processes may be output on the analog and/or digital output connections of process tool 200. Non-limiting examples of process tool sensors that may be monitored include mass flow controllers (MFCs), pressure sensors (such as manometers), thermocouples, etc. Appropriately programmed feedback and control algorithms may be used with data from these sensors to maintain process conditions.

System controller 250 may provide machine-readable instructions for implementing the above-described deposition processes. The instructions may control a variety of process parameters, such as DC power level, RF bias power level, pressure, temperature, etc. The instructions may control the parameters to operate in-situ deposition of film stacks according to various embodiments described herein.

The system controller will typically include one or more memory devices and one or more processors configured to execute machine-readable instructions so that the apparatus will perform operations in accordance with the processes disclosed herein. Machine-readable, non-transitory media containing instructions for controlling operations in accordance with the substrate doping processes disclosed herein may be coupled to the system controller.

The various apparatuses and methods described above may be used in conjunction with lithographic patterning tools and/or processes, for example, for the fabrication or manufacture of semiconductor devices, displays, LEDs, photovoltaic panels and the like. Typically, though not necessarily, such tools will be used or processes conducted together and/or contemporaneously in a common fabrication facility.

Lithographic patterning of a film typically includes some or all of the following operations, each operation enabled with a number of possible tools: (1) application of photoresist on a substrate, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or substrate by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

OTHER EMBODIMENTS

Although the foregoing disclosed techniques, operations, processes, methods, systems, apparatuses, tools, films, chemistries, and compositions have been described in detail within the context of specific embodiments for the purpose of promoting clarity and understanding, it will be apparent to one of ordinary skill in the art that there are many alternative ways of implementing foregoing embodiments which are within the spirit and scope of this disclosure. Accordingly, the embodiments described herein are to be viewed as illustrative of the disclosed inventive concepts rather than restrictively, and are not to be used as an impermissible basis for unduly limiting the scope of any claims eventually directed to the subject matter of this disclosure.

We claim:

1. An apparatus for depositing a film of material on a semiconductor substrate, the apparatus comprising:
   a processing chamber;
   a substrate holder in the processing chamber;
   a showerhead for flowing film precursor and primary purge gas into the processing chamber;
   a showerhead collar for flowing a secondary purge gas into the processing chamber;
   one or more primary flow valves for controlling flow of film precursor and flow of primary purge gas through the showerhead;
   one or more secondary flow valves for controlling flow of secondary purge gas through the showerhead collar;
   a valve-operated vacuum source for removing primary and secondary purge gases from the processing chamber, and for removing film precursor from the volume surrounding the substrate in the processing chamber;
   a plasma generator for generating a plasma in the processing chamber; and
   one or more controllers comprising machine-readable, non-transitory media containing instructions for operating the one or more valves, vacuum source, and plasma generator to deposit a film of material onto the semiconductor substrate, including instructions for:
   (a) operating the primary flow valve(s) to flow a film precursor into the processing chamber;
   (b) controlling conditions within the processing chamber such that film precursor adsorbs onto the substrate in the processing chamber forming an adsorption-limited layer;
   (c) operating the primary flow valve(s) to flow a primary purge gas into the processing chamber and operating the valve-operated vacuum source to evacuate it thereby removing at least some unadsorbed film precursor from the volume surrounding the adsorbed film precursor; and
   (d) operating the plasma generator to form a plasma in the processing chamber, the plasma activating reaction of the adsorbed film precursor to form a film layer on the substrate;
   (e) operating the secondary flow valve(s) to flow a secondary purge gas into the processing chamber while activating the reaction in (d), wherein the secondary purge gas comprises a chemical species having an ionization energy and/or a disassociation energy equal to or greater than that of $O_2$.

2. The apparatus of claim 1, wherein:
   the showerhead comprises:
      a stem portion;
      a head portion; and
      apertures in the bottom surface of the head portion for flowing film precursor and primary purge gas into the processing chamber; and
   the showerhead collar comprises:
      a stem portion;
      a head portion; and
      apertures in the stem portion for flowing a secondary purge gas into the processing chamber.

3. The apparatus of claim 2, wherein the apertures of the showerhead are holes and the apertures of the showerhead collar are slots.

4. The apparatus of claim 1, wherein the chemical species comprising the secondary purge gas is $O_2$.

5. The apparatus of claim 1, wherein the primary purge gas comprises an inert gas.

6. The apparatus of claim 5, wherein the primary purge gas comprises Ar and/or $N_2$.

7. The apparatus of claim 1, wherein the one or more controllers further includes instructions for operating the secondary flow valve(s) to flow the secondary purge gas into the processing chamber during (a)-(d).

8. The apparatus of claim 1, wherein a flow of carrier gas is used to flow the film precursor into the processing chamber in (a).

9. The apparatus of claim 8, wherein the carrier gas comprises an inert gas.

10. The apparatus of claim 9, wherein the carrier gas comprises $N_2$ and/or Ar.

11. The apparatus of claim 1, wherein the one or more controllers further includes instructions for repeating (a)-(e) one or more times to deposit additional layer(s) of film on the substrate.

12. The apparatus of claim 1, wherein the one or more controllers further includes instructions for operating the secondary flow valve(s) to flow the secondary purge gas into the processing chamber for at least a portion of the time during (a).

13. The apparatus of claim 1, wherein the one or more controllers further includes instructions for operating the secondary flow valve(s) to flow the secondary purge gas into the processing chamber for at least a portion of the time during each of (a), (b), (c), and (d).

14. The apparatus of claim 1, wherein the showerhead collar is configured to cause the secondary purge gas to flow into the process chamber in a direction substantially parallel to the plane of the substrate.

15. The apparatus of claim 1, wherein the showerhead is configured to cause the primary purge gas to flow into the process chamber in a direction substantially perpendicular to the plane of the substrate.

16. The apparatus of claim 1, wherein the primary purge gas in (c) flows into the process chamber at a rate of about 5,000 to 45,000 sccm.

17. The apparatus of claim 1, wherein the secondary purge gas in (e) flows into the process chamber at a rate of about 1 to 30,000 sccm.

* * * * *